(12) United States Patent
Masuoka et al.

(10) Patent No.: US 8,755,219 B2
(45) Date of Patent: Jun. 17, 2014

(54) HIERARCHICAL WORDLINE LOADLESS 4GST-SRAM WITH A SMALL CELL AREA

(71) Applicant: Unisantis Electronics Singapore Pte. Ltd, Singapore (SG)

(72) Inventors: Fujio Masuoka, Tokyo (JP); Shintaro Arai, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/762,940

(22) Filed: Feb. 8, 2013

(65) Prior Publication Data

US 2014/0016403 A1 Jan. 16, 2014

Related U.S. Application Data

(60) Provisional application No. 61/599,073, filed on Feb. 15, 2012.

(51) Int. Cl.
*G11C 11/412* (2006.01)

(52) U.S. Cl.
USPC ............... 365/156; 365/154; 365/72; 365/63; 257/369; 257/329; 257/394

(58) Field of Classification Search
USPC ........ 365/156, 154, 51, 72, 63; 257/369, 368, 257/329, 393, 394
See application file for complete search history.

(56) References Cited

U.S. PATENT DOCUMENTS

| 6,111,799 | A | 8/2000 | Uchida | |
|---|---|---|---|---|
| 7,498,637 | B2* | 3/2009 | Yamaoka et al. | 257/351 |
| 2008/0225574 | A1* | 9/2008 | Kim | 365/156 |
| 2011/0062523 | A1 | 3/2011 | Masuoka et al. | |
| 2011/0103137 | A1* | 5/2011 | Beat | 365/156 |

FOREIGN PATENT DOCUMENTS

| JP | 2188966 A | 7/1990 |
|---|---|---|
| JP | 7201184 A | 8/1995 |
| JP | 2000137986 A | 5/2000 |
| JP | 2011061110 A | 3/2011 |

* cited by examiner

*Primary Examiner* — Andrew Q Tran
(74) *Attorney, Agent, or Firm* — Laurence A. Greenberg; Werner H. Stemer; Ralph E. Locher

(57) ABSTRACT

In a loadless 4T-SRAM constituted using vertical-type transistor SGTs, a small SRAM cell area is realized. In a static memory cell constituted using four MOS transistors, the MOS transistors are SGTs formed on a bulk substrate in which the drains, gates, and sources are arranged in the vertical direction. The gates of access transistors are shared, as a word line, among a plurality of cells adjacent to one another in the horizontal direction. One contact for the word line is formed for each group of cells, thereby realizing a CMOS-type loadless 4T-SRAM with a very small memory cell area.

6 Claims, 25 Drawing Sheets

(a)

(b)

RRIOR ART (a)

(b)

HIERARCHICAL WORDLINE LOADLESS 4GST-SRAM WITH A SMALL CELL AREA

CROSS-REFERENCE TO RELATED APPLICATION

This application claims the benefit, under 35 U.S.C. §119 (e), of provisional patent application No. 61/599,073, filed Feb. 15, 2012; the prior application is herewith incorporated by reference in its entirety.

BACKGROUND OF THE INVENTION

Field of the Invention

The present invention relates to a semiconductor memory device, and more particularly relates to a semiconductor memory device including a static random access memory (SRAM).

To enhance the degree of integration and performance of semiconductor devices, a surrounding gate transistor (SGT) which is a vertical-type gate transistor having a gate formed on the sidewall of a pillar-shaped semiconductor layer, formed on the surface of a semiconductor substrate, so as to surround the pillar-shaped semiconductor layer has been proposed (for example, Japanese Unexamined Patent Application Publication No. 2-188966). Because the drain, gate, and source are arranged in the vertical direction in the SGT, the occupied area can be greatly reduced, compared with a planar-type transistor of the related art.

To constitute a large-scale integrated circuit (LSI) using SGTs, it is essential to use an SRAM including a combination of SGTs as a cache memory therefor. In recent years, there has been a very strong demand for increasing the capacity of an SRAM mounted on an LSI. In the case where SGTs are used, it is essential to realize an SRAM with a small cell area.

Japanese Unexamined Patent Application Publication No. 2011-61110 discusses a loadless 4T-SRAM formed on a bulk substrate by using four SGTs. FIG. 1 is an equivalent circuit diagram of the loadless 4T-SRAM. Also, FIG. 20 is a plan view of, and FIG. 21 includes cross-sectional views of the loadless 4T-SRAM in Japanese Unexamined Patent Application Publication No. 2011-61110.

Using the equivalent circuit of the loadless 4T-SRAM illustrated in FIG. 1, the operation principle of the loadless 4T-SRAM will be discussed below. The loadless 4T-SRAM includes a total of four transistors, namely, two access transistors for accessing a memory, which is a PMOS, and two driver transistors for driving a memory, which is an NMOS.

Hereinafter, as an example of the operation of a memory cell in FIG. 1, the operation of maintaining data in the case where "L" data is stored in a storage node Qa1 and "H" data is stored in a storage node Qb1 will be described. While data is being maintained, a word line WL1, and bit lines BL1 and BLB1 are all driven at "H" potential. The off leak current of the access transistors (Qp11 and Qp21) is set to be, for example, about ten times to a thousand times greater than the off leak current of the driver transistors. Thus, the "H" level of the storage node Qb1 is maintained by the off leak current flowing from the bit line BLB1 to the storage node Qb1 through the access transistor Qp21. In contrast, the "L" level of the storage node Qa1 is maintained to be stable by the driver transistor Qn11.

FIG. 20 is a layout diagram of an SRAM memory cell of a first embodiment of Japanese Unexamined Patent Application Publication No. 2011-61110. In the SRAM cell array, unit cell UCs illustrated in FIG. 20 are repeatedly arranged.

FIGS. 21A to 21D illustrate the cross-sectional structures taken at cut lines A-A', B-B', C-C', and D-D' of the layout diagram illustrated in FIG. 20.

Firstly, using FIGS. 20 and 21, the layout of the SRAM cell of the first embodiment of Japanese Unexamined Patent Application Publication No. 2011-61110 will be described. In the SRAM cell array on a substrate, an n-well, which is a first well 601a, is formed, and diffusion layers on the substrate are separated by an element separation layer 602. A first storage node Qa6 formed of diffusion layers on the substrate is formed of a first p+ diffusion layer 603a and a first n+ diffusion layer 604a and is connected by a first silicide layer 613a formed on the surface of the substrate. Similarly, a second storage node Qb6 formed of diffusion layers on the substrate is formed of a second p+ diffusion layer 603b and a second n+ diffusion layer 604b and is connected by a second silicide layer 613b formed on the surface of the substrate. To suppress leak to the substrate from the n+ diffusion layers, which have the same conductivity type as the n-well, which is the first well 601a, a first leak preventing diffusion layer 601b or a second leak preventing diffusion layer 601c, which is a diffusion layer having a conductivity type different from the first well, is formed on the top of the first well. The first and second leak preventing diffusion layers are separated by the element separation layer 602 for the individual diffusion layers on the substrate.

Qp16 and Qp26 are access transistors for accessing a memory cell, which is a PMOS. Qn16 and Qn26 are driver transistors for driving a memory cell, which is an NMOS.

One unit cell UC has transistors arranged in two rows and two columns on the substrate. At the first column, from the top of the diagram, the access transistor Qp16 and the driver transistor Qn16 are arranged on the first storage node Qa6. Also, on the second row, from the top of the diagram, the access transistor Qp26 and the driver transistor Qn26 are arranged on the second storage node Qb6. The SRAM cell array of this embodiment is constituted by consecutively arranging unit cells UCs, each having four such transistors, in the vertical direction of the diagram.

A contact 610a formed on the first storage node Qa6 is connected by a node connection line Na6 to a contact 611b formed on a gate line extending from a gate electrode of the driver transistor Qn26. Also, a contact 610b formed on the second storage node Qb6 is connected by a node connection line Nb6 to a contact 611a formed on a gate line extending from a gate electrode of the driver transistor Qn16. A contact 606a formed on the top of the access transistor Qp16 is connected to a bit line BL6. A contact 606b formed on the top of the access transistor Qp26 is connected to a bit line BLB6. A common contact 607 formed on a gate line extending from gate electrodes of the access transistor Qp16 and the access transistor Qp26 is connected to a word line WL6. Contacts (608a and 608b) formed on the top of the driver transistors (Qn16 and Qn26) are connected to a wiring layer Vss6, which is at a ground potential.

Next, using the cross-sectional views illustrated in FIG. 21, the structure of the SRAM cell of Japanese Unexamined Patent Application Publication No. 2011-61110 will be described. As illustrated in FIG. 21(a), the n-well, which is the first well 601a common to the SRAM cell array, is formed on the substrate, and diffusion layers on the substrate are separated by the element separation layer 602. At the first storage node Qa6 formed of diffusion layers on the substrate, the first p+ drain diffusion layer 603a is formed by implanting an impurity or the like. At the second storage node Qb6 formed of diffusion layers on the substrate, the second p+ drain diffusion layer 603b is formed by implanting an impurity or the like. Also, the first and second silicide layers (613a and 613b) are formed on the first and second p+ drain diffusion layers (603a and 603b), respectively. A pillar-shaped silicon layer 621a constituting the access transistor Qp16 is formed on the p+ drain diffusion layer 603a. A pillar-shaped silicon layer 621b constituting the access transistor Qp26 is formed on the p+ drain diffusion layer 603b.

A gate insulating film 617 and a gate electrode 618 are formed around each of the pillar-shaped silicon layers. A p+ source diffusion layer 616 is formed on the top of each of the pillar-shaped silicon layers by implanting an impurity or the like, and a silicide layer 615 is formed on the surface of the source diffusion layer. The contact 606a formed on the access transistor Qp16 is connected to the bit line BL6. The contact 606b formed on the access transistor Qp26 is connected to the bit line BLB6. The contact 607 formed on a gate line 618a extending from the gates of the access transistors Qp16 and Qp26 is connected to the word line WL6.

As illustrated in FIG. 21B, the n-well, which is the first well 601a common to the SRAM cell array, is formed on the substrate, and diffusion layers on the substrate are separated by the element separation layer 602. At the first storage node Qa6 formed of diffusion layers on the substrate, the first n+ drain diffusion layer 604a is formed by implanting an impurity or the like. At the second storage node Qb6 formed of diffusion layers on the substrate, the second n+ drain diffusion layer 604b is formed by implanting an impurity or the like. Also, the first and second silicide layers (613a and 613b) are formed on the first and second n+ drain diffusion layers, respectively. The contact 611a formed on the first drain diffusion layer 604a is formed near the boundary between the first p+ drain diffusion layer 603a and the first n+ drain diffusion layer 604a, and is connected through the storage node connection line Nb6 to a gate line 618b extending from the gate electrode of the driver transistor Qn16.

To suppress leak to the substrate from the first n+ diffusion layer 604a, which has the same conductivity type as the first well, the first leak preventing diffusion layer 601b, which has a conductivity type different from the first well, is formed at the bottom of the first n+ diffusion layer and on the top of the first well. To suppress leak to the substrate from the second n+ diffusion layer 604b, which has the same conductivity type as the first well, the second leak preventing diffusion layer 601c, which has a conductivity type different from the first well, is formed at the bottom of the second n+ diffusion layer and on the top of the first well.

As illustrated in FIG. 21C, the n-well, which is the first well common to the SRAM cell array, is formed on the substrate, and diffusion layers on the substrate are separated by the element separation layer 602. At the first storage node Qa6 formed of diffusion layers on the substrate, the first n+ drain diffusion layer 604a is formed by implanting an impurity or the like. At the second storage node Qb6 formed of diffusion layers on the substrate, the second n+ drain diffusion layer 604b is formed by implanting an impurity or the like. Also, the first and second silicide layers (613a and 613b) are formed on the surface of the first and second n+ drain diffusion layers (604a and 604b), respectively. To suppress leak to the substrate from the first n+ diffusion layer 604a, which has the same conductivity type as the first well, the first leak preventing diffusion layer 601b, which has a conductivity type different from the first well, is formed at the bottom of the first n+ diffusion layer and on the top of the first well. To suppress leak to the substrate from the second n+ diffusion layer 604b, which has the same conductivity type as the first well, the second leak preventing diffusion layer 601c, which has a conductivity type different from the first well, is formed at the bottom of the second n+ diffusion layer and on the top of the first well.

A pillar-shaped silicon layer 622a forming the driver transistor Qn16 is formed on the first n+ drain diffusion layer 604a. A pillar-shaped silicon layer 622b forming the driver transistor Qn26 is formed on the second n+ drain diffusion layer 604b. The gate insulating film 617 and the gate electrode 618 are formed around each of the pillar-shaped silicon layers. An n+ source diffusion layer 614 is formed on the top of each of the pillar-shaped silicon layers by implanting an impurity or the like, and the silicide layer 615 is formed on the surface of the source diffusion layer. The contacts (608a and 608b) formed on the driver transistors (Qn16 and Qn26) are connected to the ground potential Vss6 through the wiring layer.

As illustrated in FIG. 21D, the n-well, which is the first well common to the SRAM cell array, is formed on the substrate, and diffusion layers on the substrate are separated by the element separation layer 602. At the second storage node Qb6 formed of diffusion layers on the substrate, the second p+ drain diffusion layer 603b and the second n+ drain diffusion layer 604b are formed by implanting an impurity or the like. The second silicide layer 613b is formed on the drain diffusion layers. The second p+ drain diffusion layer 603b and the second n+ drain diffusion layer 604b are directly connected by the second silicide layer 613b. To suppress leak to the substrate from the second n+ diffusion layer 604b, which has the same conductivity type as the first well, the second leak preventing diffusion layer, which has a conductivity type different from the first well 601a, is formed at the bottom of the second n+ diffusion layer and on the top of the first well.

The pillar-shaped silicon layer 622b forming the access transistor Qp26 is formed on the second p+ drain diffusion layer 603a. The pillar-shaped silicon layer 622b forming the driver transistor Qn26 is formed on the second n+ drain diffusion layer 604b. The gate insulating film 617 and the gate electrode 618 are formed around each of the pillar-shaped silicon layers. Source diffusion layers are formed on the top of the pillar-shaped silicon layers, respectively, by implanting an impurity or the like, and the silicide layer 615 is formed on the surface of the source diffusion layers. The contact 608b formed on the access transistor Qp26 is connected to the bit line BLB6. The contact 608b formed on the driver transistor Qn26 is connected to the ground potential Vss6.

The contact 610b is formed on a gate line 618c extending from the gate electrode of the driver transistor Qn26. The contact 610b is connected to the contact 611a formed on the first drain diffusion layer through the storage node connection line Na6. The contact 611b is formed on the second n+ drain diffusion layer 604b. The contact 611b is connected to the contact 611a formed on the gate line 618b extending from the gate electrode of the driver transistor Qn16 through the storage node connection line Nb6.

In the 4T-SRAM cell illustrated in FIGS. 20 and 21, the word line contact formed on the gates between the access transistors gives rise to dead space in the vertical direction, and the SRAM cell may not be formed in an efficient manner.

SUMMARY OF THE INVENTION

The present invention has been made with regard to the above-described circumstances, and it is an object of the invention to realize a loadless 4T-SRAM cell using SGTs with a smaller cell area than in a loadless 4T-SRAM using SGTs proposed in the past.

With the above and other objects in view there is provided, in accordance with the invention, a semiconductor memory device, comprising:

a plurality of static memory cells, each of which includes four MOS transistors arranged on a substrate, wherein the four MOS transistors function as a first and a second PMOS access transistors and a first and a second NMOS driver transistors, respectively, the first and the second PMOS access transistors for supplying an electric charge in order to maintain data in a memory cell and accessing the memory, the first and the second NMOS driver transistors for driving storage nodes in order to read data from the memory cell, wherein, in the first and second PMOS access transistors for supplying electric charge in order to maintain data in a memory cell and accessing the memory, a P-type first diffusion layer, a first pillar-shaped semiconductor layer, and a P-type second diffusion layer are arranged in a hierarchical manner in a vertical direction on the substrate, the first pillar-shaped semiconductor layer is arranged between the first diffusion layer formed at the bottom of the first pillar-shaped semiconductor layer and the second diffusion layer formed on the top of the first pillar-shaped semiconductor layer, and a first gate is formed on a sidewall of the first pillar-shaped semiconductor layer, wherein, in the first and second NMOS driver transistors for driving storage nodes in order to read data from the memory cell, an N-type third diffusion layer, a second pillar-shaped semiconductor layer, and an N-type fourth diffusion layer are arranged in a hierarchical manner in the vertical direction on the substrate, the second pillar-shaped semiconductor layer is arranged between the third diffusion layer formed at the bottom of the second pillar-shaped semiconductor layer and the fourth diffusion layer formed on the top of the second pillar-shaped semiconductor layer, and a second gate is formed on a sidewall of the second pillar-shaped semiconductor layer, wherein the first PMOS access transistor and the first NMOS driver transistor are arranged adjacent to each other, wherein the second PMOS access transistor and the second NMOS driver transistor are arranged adjacent to each other, wherein a first well common to a plurality of memory cells for supplying potential to the substrate is formed on the substrate, wherein the P-type first diffusion layer formed at the bottom of the first PMOS access transistor and the N-type third diffusion layer formed at the bottom of the first NMOS driver transistor are connected to each other, wherein the P-type first diffusion layer and the N-type third diffusion layer connected to each other function as a first storage node for maintaining data stored in the memory cell, wherein, to prevent leak between the N-type third diffusion layer or the P-type first diffusion layer and the first well, a first leak preventing diffusion layer having a conductivity type opposite to the first well is formed between the N-type third diffusion layer or the P-type first diffusion layer and the first well, so that the bottom of the first leak preventing diffusion layer becomes shallower than an element separation layer, wherein the first leak preventing diffusion layer is directly connected to the P-type first diffusion layer or the N-type third diffusion layer, wherein the P-type first diffusion layer formed at the bottom of the second PMOS access transistor, and the N-type third diffusion layer formed at the bottom of the second NMOS driver transistor are connected to each other, wherein the P-type first diffusion layer and the N-type third diffusion layer connected to each other function as a second storage node for maintaining data stored in the memory cell, wherein, to prevent leak between the N-type third diffusion layer or the P-type first diffusion layer and the first well, a second leak preventing diffusion layer having a conductivity type opposite to the first well is formed between the N-type third diffusion layer or the P-type first diffusion layer and the first well, so that the bottom of the second leak preventing diffusion layer becomes shallower than the element separation layer, wherein the second leak preventing diffusion layer is directly connected to the P-type first diffusion layer or the N-type third diffusion layer, wherein gates of the first and second PMOS driver transistors are connected to each other by a first gate line, and the first gate line forms a word line by connecting to gates of the first and second PMOS access transistors in two or more memory cells adjacent to one another, and wherein, for each group of memory cells adjacent to one another, a first contact is formed on the first gate line serving as the word line.

In the semiconductor memory device according to another aspect of the above-described invention, as in a memory cell area, pillars may be arranged in an area in which the first contact is formed on the first gate line serving as the word line.

In the semiconductor memory device according to yet another aspect of the above-described invention, a second gate line extending from the gate of the first NMOS driver transistor may be connected by a second contact common to the diffusion layers functioning as the second storage node, and a third gate line extending from the gate of the second NMOS driver transistor may be connected by a third contact common to the diffusion layers functioning as the first storage node.

In the semiconductor memory device according to yet another aspect of the above-described invention, a peripheral length of sidewalls of the pillar-shaped semiconductor layers forming the first and second NMOS driver transistors may be longer than or equal to a peripheral length of sidewalls of the pillar-shaped semiconductor layers forming the first and second PMOS access transistors, or the peripheral length of the sidewalls of the pillar-shaped semiconductor layers forming the first and second NMOS driver transistors may be shorter than or equal to the peripheral length of the sidewalls of the pillar-shaped semiconductor layers forming the first and second PMOS access transistors.

In the semiconductor memory device according to yet another aspect of the above-described invention, the four MOS transistors may be arranged in two rows and two columns on an insulating film, the first PMOS access transistor may be arranged at a first column of a first row, the first NMOS driver transistor may be arranged at a first column of a second row, the second PMOS access transistor may be arranged at a second column of the first row, and the second NMOS driver transistor may be arranged at a second column of the second row.

In the semiconductor memory device according to yet another aspect of the above-described invention, regarding the four MOS transistors, the first PMOS access transistor and the second PMOS access transistor may be arranged adjacent to each other, in one direction orthogonal to a direction in which the first PMOS access transistor and the second PMOS access transistor are arranged adjacent to each other, the first NMOS driver transistor may be arranged adjacent to the first PMOS access transistor, and in the other direction orthogonal to the direction in which the first PMOS access transistor and the second PMOS access transistor are arranged adjacent to each other, the second NMOS driver transistor may be arranged adjacent to the second PMOS access transistor.

As has been described above, according to aspects of the present invention, in a static memory cell constituted using four MOS transistors, the MOS transistors are SGTs in which the drains, gates, and sources are arranged in the vertical direction. The gates of access transistors serve as a word line that is shared among a plurality of cells adjacent to one another in the horizontal direction. A contact for the word line is formed for a group of cells. Accordingly, a CMOS-type loadless 4T-SRAM with a very small memory cell area can be realized.

Other features which are considered as characteristic for the invention are set forth in the appended claims.

Although the invention is illustrated and described herein as embodied in a semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

First Embodiment

Figure 1:
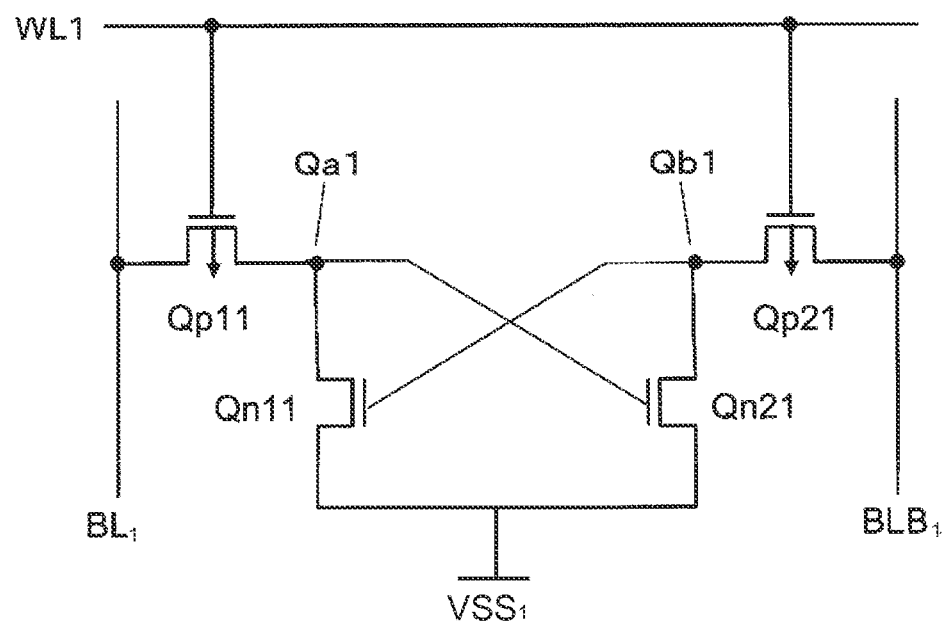
FIG. 1 is an equivalent circuit diagram illustrating an SRAM of a first embodiment of the present invention.

FIG. 1 is an equivalent circuit diagram of a memory cell of a loadless 4T-SRAM used in a first embodiment of the present invention. In FIG. 1, BL1 and BLB1 denote bit lines; WL1 denotes a word line; Vss1 denotes a ground potential; Qp11 and Qp21 denote access transistors for accessing a memory cell and having the function of charging storage nodes to be "H"; Qn11 and Qn21 are driver transistors for driving the storage nodes to read data in the memory cell; and Qa1 and Qb1 are storage nodes for storing data.

Figure 2:
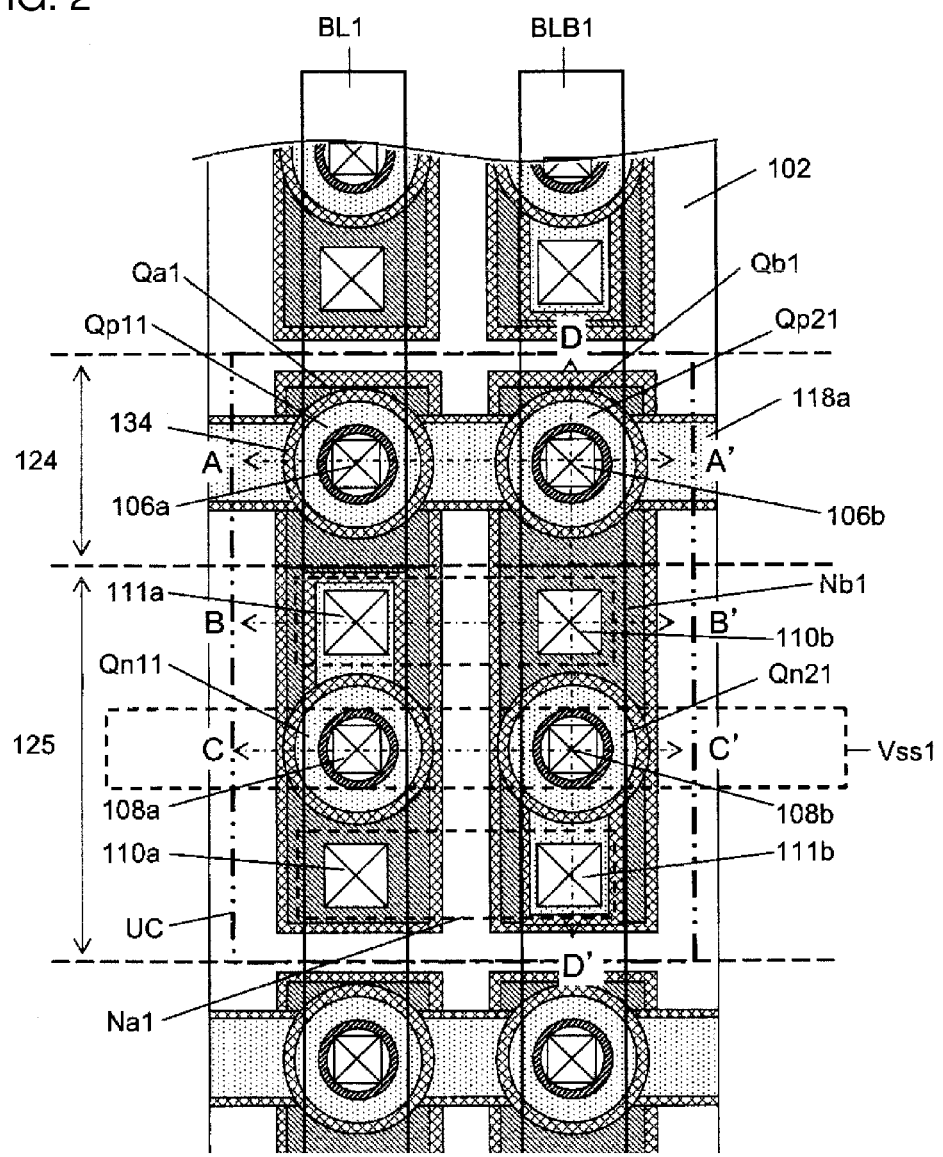
FIG. 2 is a plan view of an SRAM indicating the first embodiment of the present invention.

FIG. 2 is a layout diagram of an SRAM memory cell according to the first embodiment of the present invention. In the SRAM cell array, unit cell UCs illustrated in FIG. 2 are repeatedly arranged. FIG. 4A to D illustrate the cross-sectional structures taken at cut lines A-A', B-B', C-C', and D-D' of the layout diagram illustrated in FIG. 2.

Firstly, with reference to FIGS. 2 and 4, the layout of this embodiment will be described. In the SRAM cell array on a substrate, an n-well, which is a first well 101a, is formed, and diffusion layers on the substrate are separated by an element separation layer 102 made of an insulating film such as an oxide film. The first storage node Qa1 formed of diffusion layers on the substrate is formed of a first p+ diffusion layer 103a and a first n+ diffusion layer 104a and is connected by a first silicide layer 113a formed on the surface of the substrate. Similarly, the second storage node Qb1 formed of diffusion layers on the substrate is formed of a second p+ diffusion layer 103b and a second n+ diffusion layer 104b and is connected by a second silicide layer 113b formed on the surface of the substrate. To suppress leak to the substrate from the n+ diffusion layers, which have the same conductivity type as the n-well, which is the first well 101a, a first leak preventing diffusion layer 101b and a second leak preventing diffusion layer 101c having a conductivity type different from the first well are formed at the bottom of the first and second n+ diffusion layers and on the top of the first well 101a. The first and second leak preventing diffusion layers are separated by the element separation layer 102 for the individual diffusion layers on the substrate.

Qp11 and Qp21 are access transistors for accessing a memory cell, which is a PMOS. Qn11 and Qn21 are driver transistors for driving a memory cell, which is an NMOS.

In this embodiment, one unit cell UC has transistors arranged in two rows and two columns on the substrate. At the first column, from the top of the diagram, the access transistor Qp11 and the driver transistor Qn11 are arranged on the first storage node Qa1. Also, at the second column, from the top of the diagram, the access transistor Qp21 and the driver transistor Qn21 are arranged on the second storage node Qb1. The SRAM cell array of this embodiment is constituted by consecutively arranging unit cells UCs, each having four such transistors, in the vertical direction of the diagram.

A contact 110a formed on the first storage node Qa1 is connected by a node connection line Na1 to a contact 111b formed on a gate line extending from a gate electrode of the driver transistor Qn21. Also, a contact 110b formed on the second storage node Qb1 is connected by a node connection line Nb1 to a contact 111a formed on a gate line extending from a gate electrode of the driver transistor Qn11. A contact 106a formed on the top of the access transistor Qp11 is connected to the bit line BL1. A contact 106b formed on the top of the access transistor Qp21 is connected to the bit line BLB1. A gate line 118a extending from the gate electrodes of the access transistors Qp11 and Qp21 is connected, as a word line, to a plurality of memory cells adjacent to one another in the horizontal direction. Contacts (108a and 108b) formed on the top of the driver transistors (Qn11 and Qn21) are connected to a wiring layer Vss1, which is at a ground potential.

Note that, to share the wiring with other memory cells, the wiring of bit lines and the wiring of the ground potential are preferably arranged at a layer higher than the node connection lines, which are the wiring in each memory cell.

Note that, as an example of the configuration of the above-described hierarchical wiring, it is possible to realize a configuration in which, to avoid contact with contacts that each line should not contact, the node connection line (Na1), the node connection line (Nb1), and the ground potential line Vss1 are wired at a layer lower than the bit lines (BL1 and BLB1).

FIG. 2 illustrates an n+ implanting area 125 and a p+ implanting area 124. In the SRAM cell array area of this embodiment, patterns for forming the n+ implanting area 125 and the p+ implanting area 124 are formed of simple lines and spaces. Therefore, size differences or alignment differences have small effects, and a size margin near the boundary between the n+ implanting area 125 and the p+ implanting area 124 can be suppressed to the minimum. This is effective to reduce, on the diagram, the vertical length of the SRAM cell (the length in the connecting direction of each SRAM cell).

Figure 3:
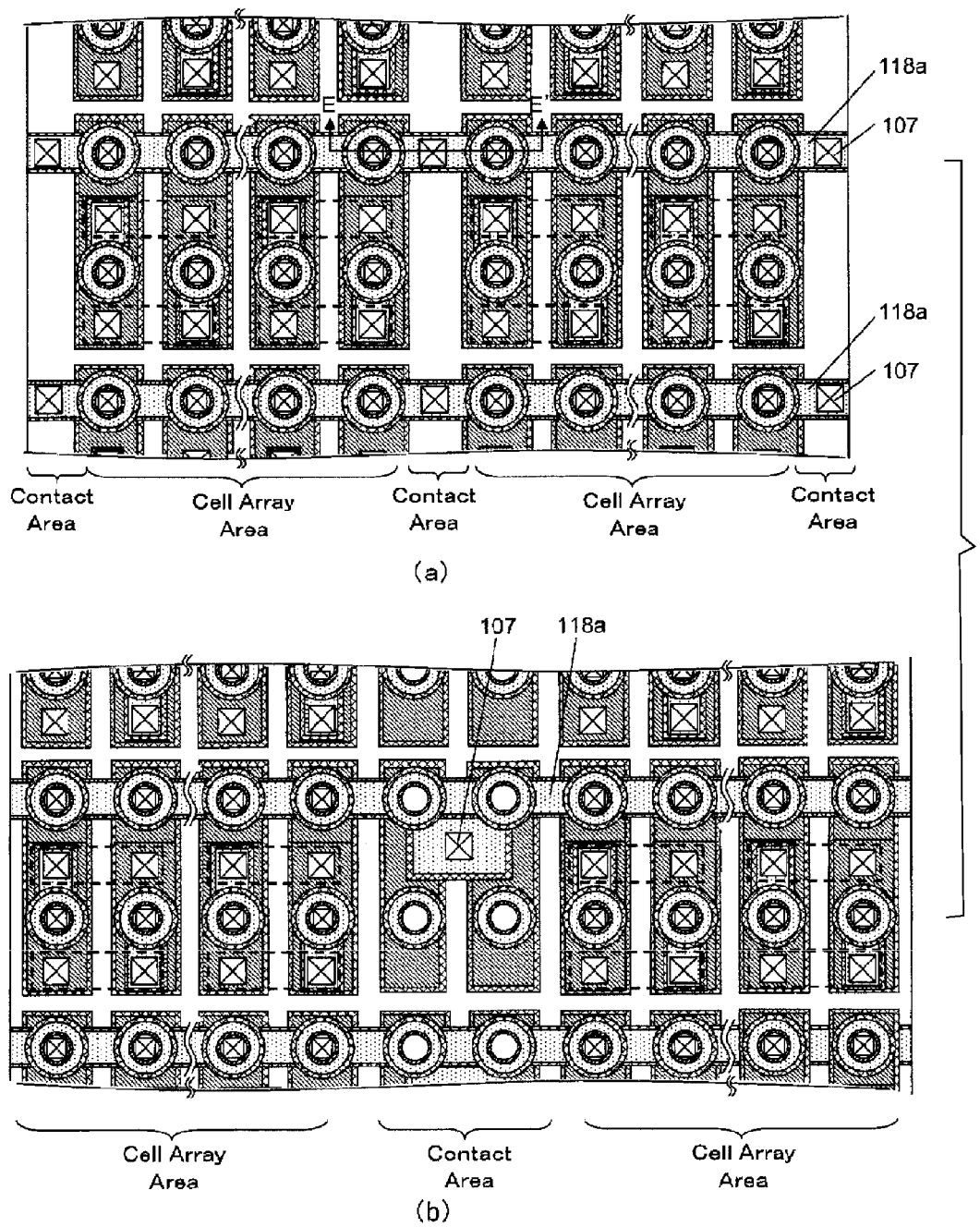
FIG. 3 includes plan views of the SRAM indicating the first embodiment of the present invention.

FIG. 3, part (a) is a plan view of a portion of the SRAM memory cell array including a plurality of SRAM memory cells. In a cell array area in the diagram, a plurality of memory cells is arranged in the horizontal direction, and the word line 118a is shared among the plurality of memory cells arranged in the horizontal direction. The word line is connected to wiring at an upper layer by a contact 107 formed in a contact area and, as necessary, backed by a wiring layer. Therefore, unlike the SRAM cells in Japanese Unexamined Patent Application Publication No. 2011-61110, it is unnecessary to form, in each cell, a contact for the word line. Thus, the SRAM cell area can be reduced.

By connecting a plurality of cells to the word line 118a, there may be a problem of reading or writing delay due to delay of a signal on the word line at a cell distant from the word line contact 107. Therefore, the number of cells connected to the word line may be determined within the range where there is no problem of reading or writing delay.

FIG. 3, part (b), is a plan view of a portion of the SRAM cell array including a plurality of SRAM cells in another case. Similarly, in a cell array area in the diagram, a plurality of memory cells is arranged in the horizontal direction, and the word line 118a is shared among the plurality of memory cells arranged in the horizontal direction. However, in part (b) of FIG. 3, as in the cell array area, pillars are arranged also in a contact area. By arranging pillars also in the contact area in the same pattern as that in the cell array area, the regularity of the same pillar arrangement as in the cell array area can be maintained also in the contact area. Thus, the difference in size between a pillar adjacent to the contact area and a pillar not adjacent to the contact area can be reduced, and errors between characteristics of SGTs adjacent to the contact area and characteristics of SGTs not adjacent to the contact area can be suppressed to the minimum.

In FIG. 3, parts (a) and (b), the configuration of the word line and the word line contact has been described using the layout of the first embodiment by way of example. In fact, this is not limited to the layout of the first embodiment, and the same or similar configuration of the word line and the word line contact is applicable to layouts of other embodiments.

In the embodiment of the present invention, the source and drain of each of the transistors constituting the SRAM are defined as follows. Regarding the driver transistors (Qn11 and Qn21), a diffusion layer formed on the top of a pillar-shaped semiconductor layer connected to the ground voltage is defined as a source diffusion layer, and a diffusion layer formed at the bottom of the pillar-shaped semiconductor layer is defined as a drain diffusion layer. Regarding the access transistors (Qp11 and Qp21), depending on the operation state, a diffusion layer formed on the top of and a diffusion layer formed at the bottom of the pillar-shaped semiconductor layer may both become the sources or drains; to simplify the description, the diffusion layer formed on the top of the pillar-shaped semiconductor layer is defined as a source diffusion layer, and the diffusion layer formed at the bottom of the pillar-shaped semiconductor layer is defined as a drain diffusion layer.

Figure 4A:
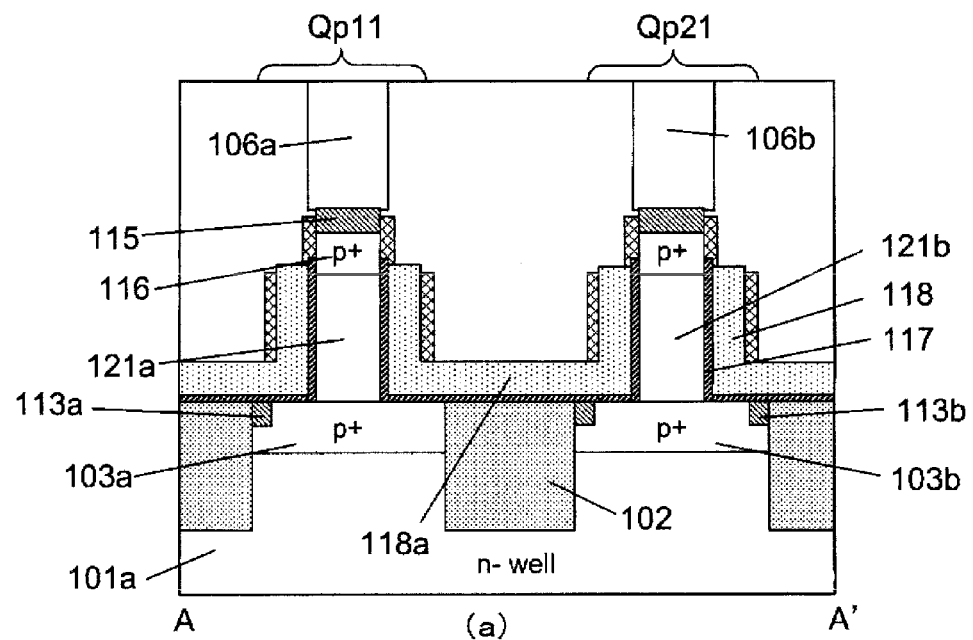
FIG. 4A is a cross-sectional view of the SRAM indicating the first embodiment of the present invention.

Next, the configuration of the SRAM of the embodiment of the present invention will be described with reference to the cross-sectional structures in FIG. 4. As illustrated in FIG. 4A, the n-well, which is the first well 101a common to the SRAM cell array, is formed on the substrate, and diffusion layers on the substrate are separated by the element separation layer 102 formed of an insulating film such as an oxide film. At the first storage node Qa1 formed of diffusion layers on the substrate, the first p+ drain diffusion layer 103a is formed by implanting an impurity or the like. At the second storage node Qb1 formed of diffusion layers on the substrate, the second p+ drain diffusion layer 103b is formed by implanting an impurity or the like. Also, the first and second silicide layers (113a and 113b) are formed on the first and second p+ drain diffusion layers (103a and 103b), respectively. A pillar-shaped silicon layer 121a constituting the access transistor Qp11 is formed on the p+ drain diffusion layer 103a. A pillar-shaped silicon layer 121b constituting the access transistor Qp21 is formed on the p+ drain diffusion layer 103b.

A gate insulating film 117 and a gate electrode 118 are formed around each of the pillar-shaped silicon layers. A p+ source diffusion layer 116 is formed on the top of each of the pillar-shaped silicon layers by implanting an impurity or the like, and a silicide layer 115 is formed on the surface of the source diffusion layer. The contact 106a formed on the access transistor Qp11 is connected to the bit line BL1. The contact 106b formed on the access transistor Qp21 is connected to the bit line BLB1. The gate line 118a extending from the gate electrodes (118) of the access transistors Qp11 and Qp21 is connected, as a word line, to a plurality of memory cells adjacent to one another in the horizontal direction.

Figure 4B:
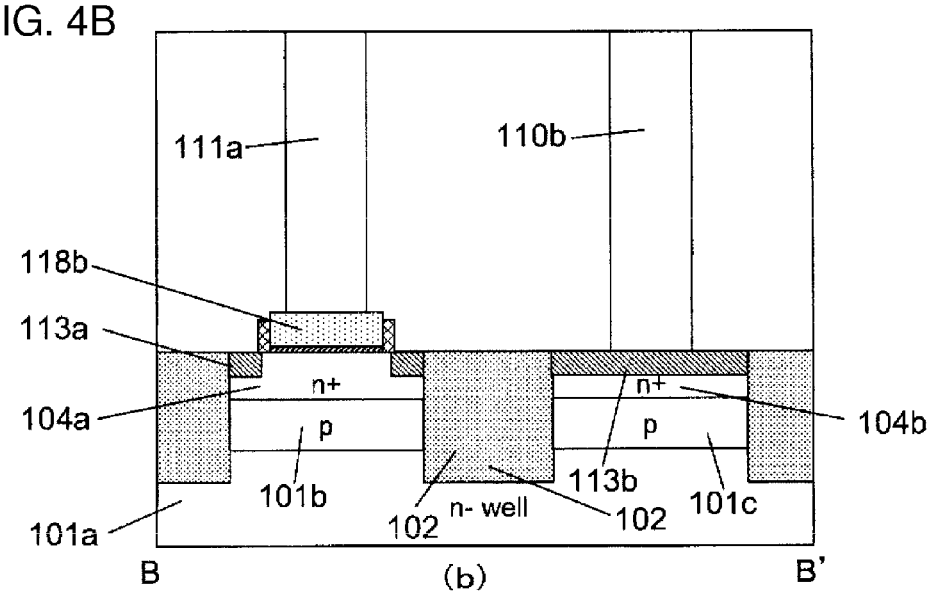
FIG. 4B is a cross-sectional view of the SRAM indicating the first embodiment of the present invention.

As illustrated in FIG. 4B, the n-well, which is the first well 101a common to the SRAM cell array, is formed on the substrate, and diffusion layers on the substrate are separated by the element separation layer 102 formed of an insulating film such as an oxide film. At the first storage node Qa1 formed of diffusion layers on the substrate, the first n+ drain diffusion layer 104a is formed by implanting an impurity or the like. At the second storage node Qb1 formed of diffusion layers on the substrate, the second n+ drain diffusion layer 104b is formed by implanting an impurity or the like. Also, the first and second silicide layers (113a and 113b) are formed on the first and second n+ drain diffusion layers, respectively. The contact 111a formed on the first drain diffusion layer 104a is formed near the boundary between the first p+ drain diffusion layer 103a and the first n+ drain diffusion layer 104a, and is connected through the storage node connection line Na1 to a gate line 118b extending from the gate electrode of the driver transistor Qn11.

To suppress leak to the substrate from the first n+ diffusion layer 104a, which has the same conductivity type as the first well, the first leak preventing diffusion layer 101b, which has a conductivity type different from the first well, is formed at the bottom of the first n+ diffusion layer and on the top of the first well. To suppress leak to the substrate from the second n+ diffusion layer 104b, which has the same conductivity type as the first well, the second leak preventing diffusion layer 101c, which has a conductivity type different from the first well, is formed at the bottom of the second n+ diffusion layer and on the top of the first well. The bottom of the first and second leak preventing diffusion layers is formed to be shallower than the bottom of the element separation layer, and the first and second leak preventing diffusion layers are separated by the element separation layer.

Figure 4C:
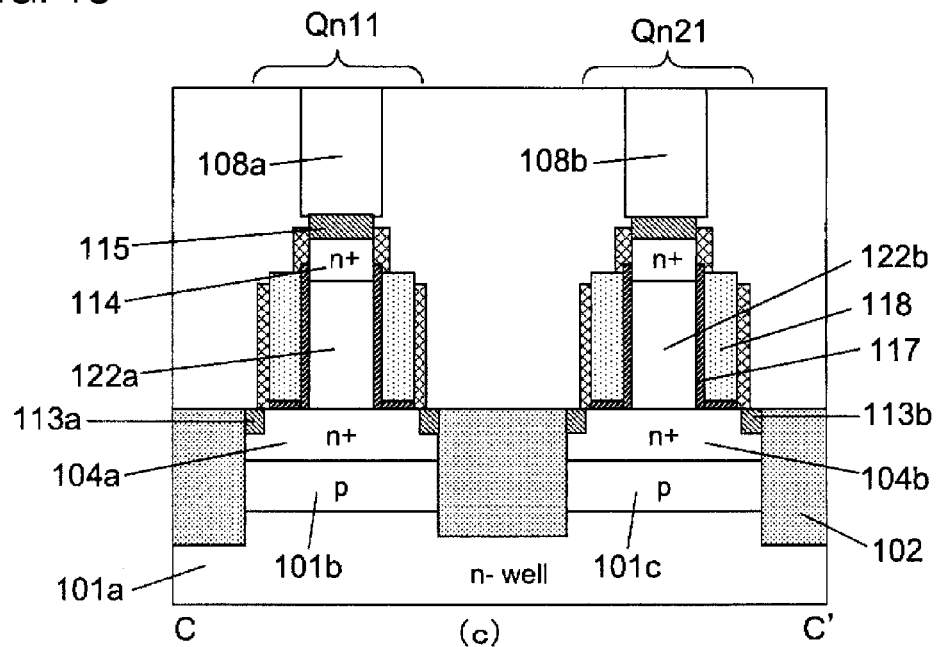
FIG. 4C is a cross-sectional view of the SRAM indicating the first embodiment of the present invention.

As illustrated in FIG. 4C, the n-well, which is the first well common to the SRAM cell array, is formed on the substrate, and diffusion layers on the substrate are separated by the element separation layer 102. At the first storage node Qa1 formed of diffusion layers on the substrate, the first n+ drain diffusion layer 104a is formed by implanting an impurity or the like. At the second storage node Qb1 formed of diffusion layers on the substrate, the second n+ drain diffusion layer 104b is formed by implanting an impurity or the like. Also, the first and second silicide layers (113a and 113b) are formed on the surface of the first and second n+ drain diffusion layers (104a and 104b), respectively. To suppress leak to the substrate from the first n+ diffusion layer 104a, which has the same conductivity type as the first well, the first leak preventing diffusion layer 101b, which has a conductivity type different from the first well, is formed at the bottom of the first n+ diffusion layer and on the top of the first well. To suppress leak to the substrate from the second n+ diffusion layer 104b, which has the same conductivity type as the first well, the second leak preventing diffusion layer 101c, which has a conductivity type different from the first well, is formed at the bottom of the second n+ diffusion layer and on the top of the first well. The bottom of the first and second leak preventing diffusion layers is formed to be shallower than the bottom of the element separation layer, and the first and second leak preventing diffusion layers are separated by the element separation layer.

A pillar-shaped silicon layer 122a forming the driver transistor Qn11 is formed on the first n+ drain diffusion layer 104a. A pillar-shaped silicon layer 122b forming the driver transistor Qn21 is formed on the second n+ drain diffusion layer 104b. The gate insulating film 117 and the gate electrode 118 are formed around each of the pillar-shaped silicon layers. An n+ source diffusion layer 114 is formed on the top of each of the pillar-shaped silicon layers by implanting an impurity or the like, and the silicide layer 115 is formed on the surface of the source diffusion layer. The contacts (108a and 108b) formed on the driver transistors (Qn11 and Qn21) are connected to the ground potential Vss1 through the wiring layer.

Figure 4D:
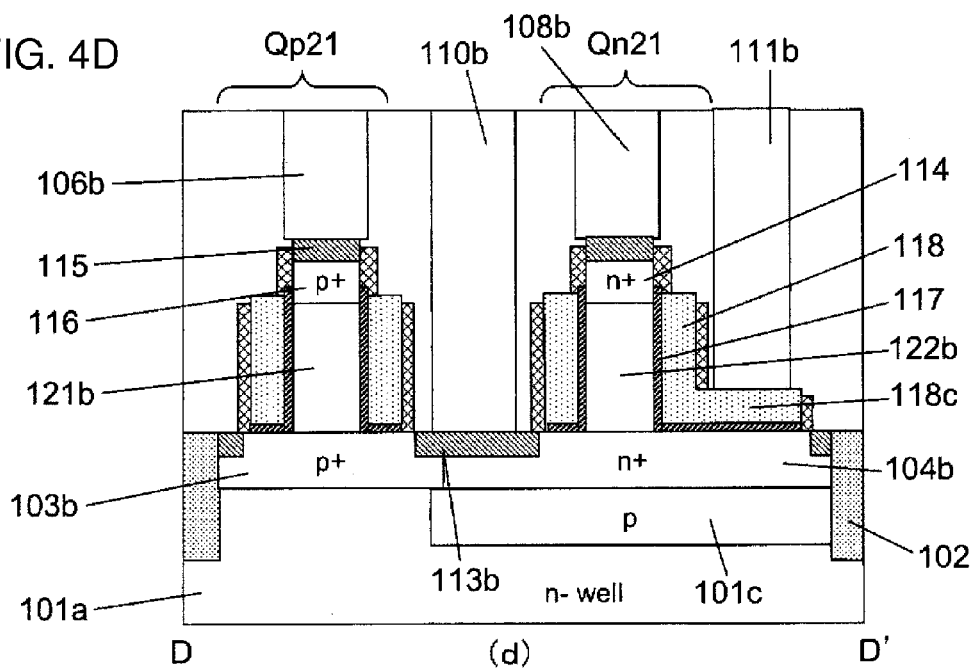
FIG. 4D is a cross-sectional view of the SRAM indicating the first embodiment of the present invention.

As illustrated in FIG. 4D, the n-well, which is the first well common to the SRAM cell array, is formed on the substrate, and diffusion layers on the substrate are separated by the element separation layer 102. At the second storage node Qb1 formed of diffusion layers on the substrate, the second p+ drain diffusion layer 103b and the second n+ drain diffusion layer 104b are formed by implanting an impurity or the like. The second silicide layer 113b is formed on the drain diffusion layers. The second p+ drain diffusion layer 103b and the second n+ drain diffusion layer 104b are directly connected by the second silicide layer 113b. To suppress leak to the substrate from the second n+ diffusion layer 104b, which has the same conductivity type as the first well, the second leak preventing diffusion layer 101c, which has a conductivity type different from the first well 101a, is formed at the bottom of the second n+ diffusion layer and on the top of the first well. In this embodiment, an N+ drain diffusion layer and a P+ drain diffusion layer are connected by silicide. When the contact resistance between the N+ drain diffusion layer and the P+ drain diffusion layer is sufficiently small, it is unnecessary to form silicide. Alternatively, instead of connecting the N+ drain diffusion layer and the P+ drain diffusion layer by silicide, connection may be made by backing the N+ drain diffusion layer and the P+ drain diffusion layer with a contact, or the N+ drain diffusion layer and the P+ drain diffusion layer may be connected by another method.

Figure 4E:
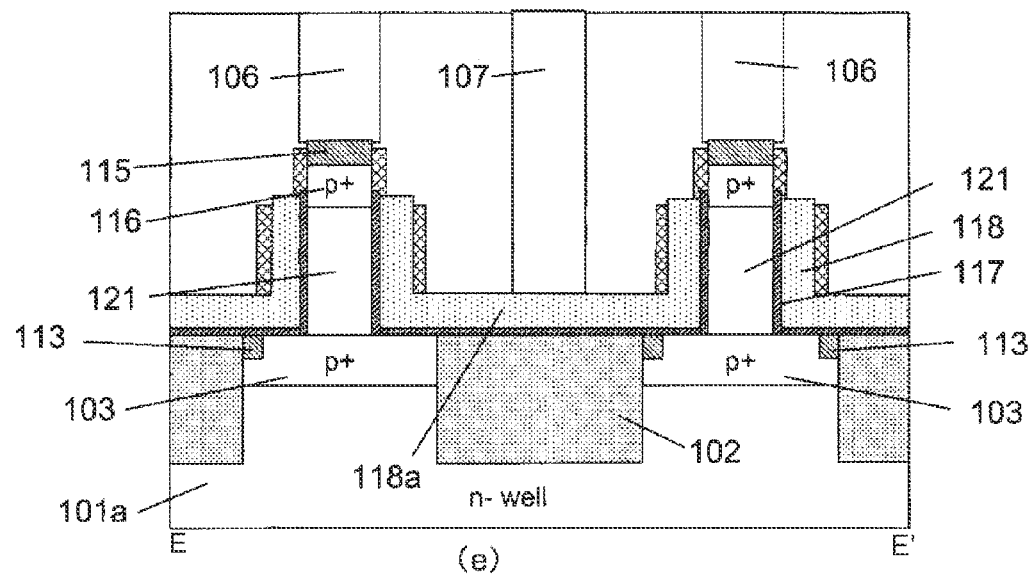
FIG. 4E is a cross-sectional view of the SRAM indicating the first embodiment of the present invention.
Figure 5A:
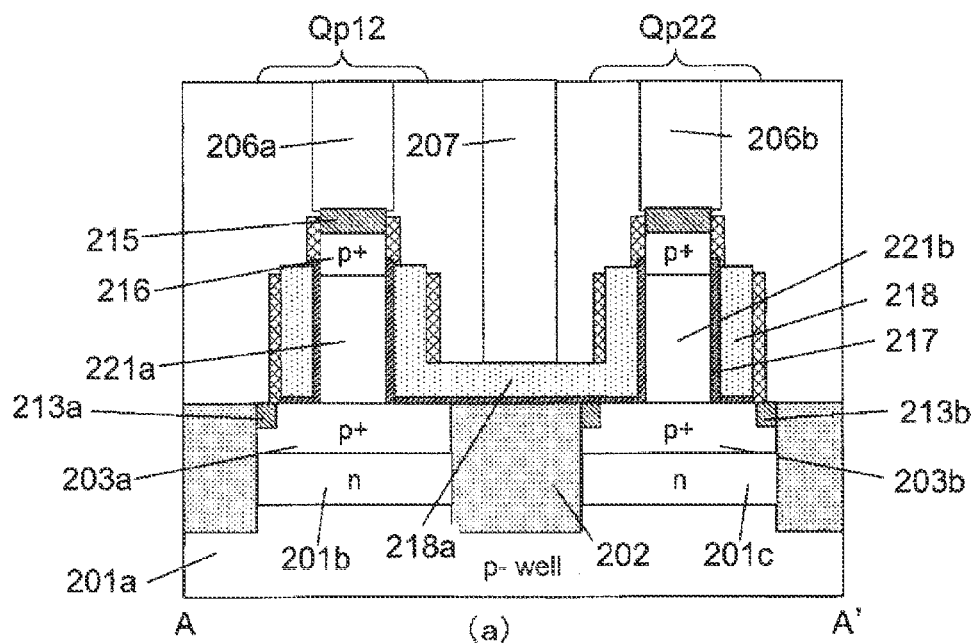
FIG. 5A is a cross-sectional view of the SRAM indicating the first embodiment of the present invention.
Figure 5B:
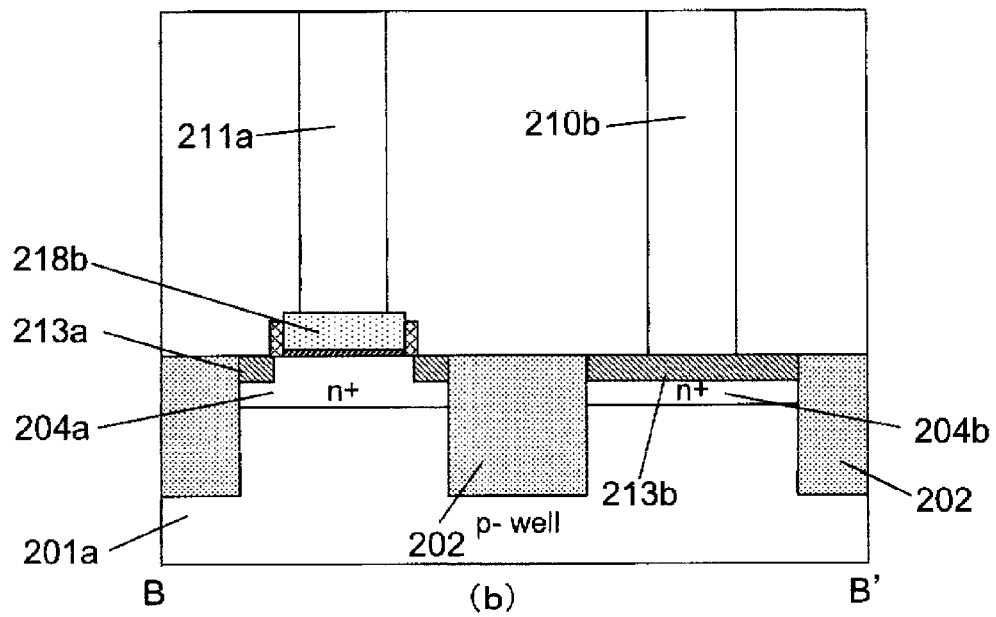
FIG. 5B is a cross-sectional view of the SRAM indicating the first embodiment of the present invention.
Figure 5C:
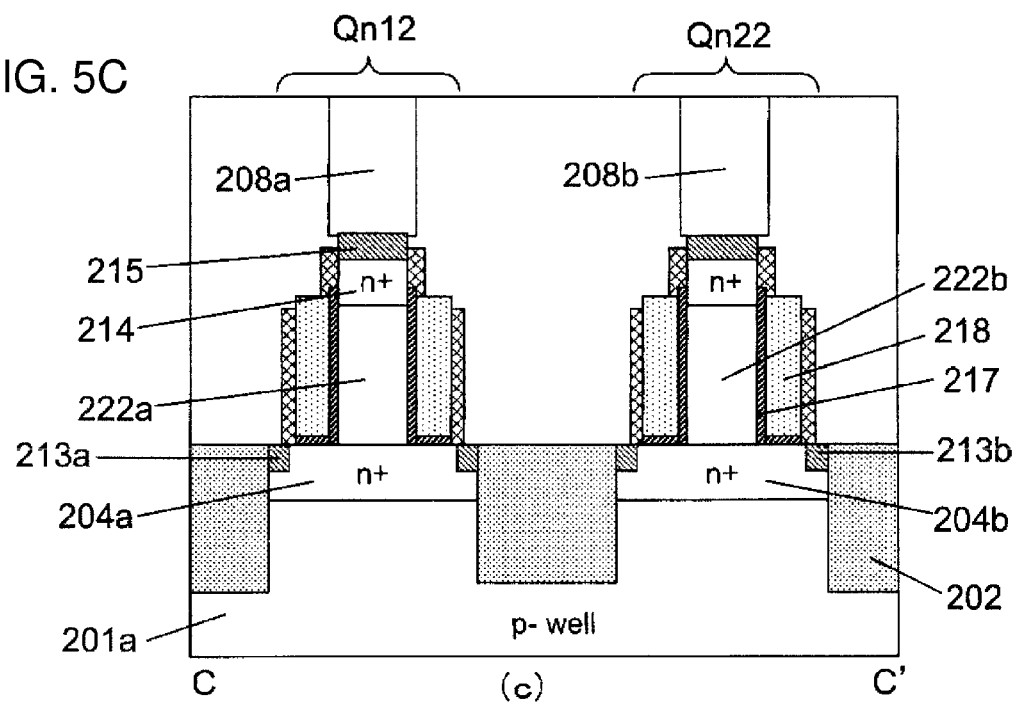
FIG. 5C is a cross-sectional view of the SRAM indicating the first embodiment of the present invention.
Figure 5D:
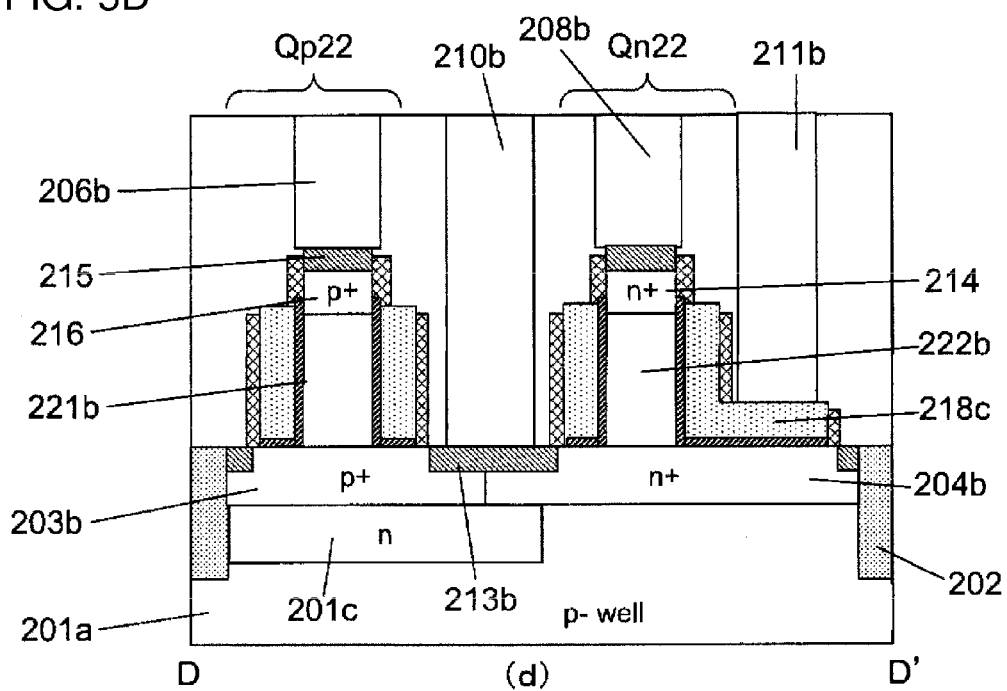
FIG. 5D is a cross-sectional view of the SRAM indicating the first embodiment of the present invention.

FIG. 4E illustrates the cross-sectional structure taken at line E-E' in FIG. 3, part (a). On the substrate, P+ drain diffusion layers 103 made of a silicon layer of cells on the left side and cells on the right side are formed. A silicide layer 113 is formed on each of the drain diffusion layers. A pillar-shaped silicon layer 121 forming an access transistor is formed on each of the P+ drain diffusion layer areas 103. The gate insulating film 117 and the gate electrode 118 are formed around each of the pillar-shaped silicon layers 121. The P+ source diffusion layer area 116 is formed on the top of each of the pillar-shaped silicon layers 121 by implanting an impurity or the like. The silicide layer 115 is formed on the surface of each of the source diffusion layer areas 116. A contact 106 formed on each of the access transistors is connected to a bit line, and the contact 107 formed on the word line 118a is connected to a word line with a lower resistance than that formed of a wiring layer at an upper layer.

The pillar-shaped silicon layer 121b forming the access transistor Qp21 is formed on the second p+ drain diffusion layer 103a. The pillar-shaped silicon layer 122b forming the driver transistor Qn21 is formed on the second n+ drain diffusion layer 104b. The gate insulating film 117 and the gate electrode 118 are formed around each of the pillar-shaped silicon layers. The source diffusion layers are formed on the top of the pillar-shaped silicon layers, respectively, by implanting an impurity or the like, and the silicide layer 115 is formed on the surface of the source diffusion layers. The contact 106b formed on the access transistor Qp21 is connected to the bit line BLB1. The contact 108b formed on the driver transistor Qn21 is connected to the ground potential Vss1.

The contact 111b is formed on a gate line 118c extending from the gate electrode of the driver transistor Qn21. The contact 111b is connected to the contact 110a formed on the first drain diffusion layer through the storage node connection line Na1. The contact 110b is formed on the second n+ drain diffusion layer 104b or the second p+ drain diffusion layer 103b. The contact 110b is connected to the contact 111a formed on the gate line 118b extending from the gate electrode of the driver transistor Qn11 through the storage node connection line Nb1.

As illustrated in FIGS. 5A to 5D, an SRAM cell can be similarly formed even with a configuration in which a first well 201a is a p-well, and N-type diffusion layers, which are a first leak preventing diffusion layer 201b and a second leak preventing diffusion layer 201c, are formed between p+ diffusion layers 203a and 203b and the first well 201a. In this case, the first leak preventing diffusion layer 201b is formed at the bottom of the p+ drain diffusion layer 203a and on the top of the first well, and the second leak preventing diffusion layer 201c is formed at the bottom of the p+ drain diffusion layer 203b and on the top of the first well, thereby preventing leak from the diffusion layers 203a and 203b to the first well.

Hereinafter, an example of a fabrication method for forming the semiconductor device of the embodiment of the present invention will be described with reference to FIGS. 6 to 14. In each diagram, part (a) is a plan view, and part (b) is a cross-sectional view taken along the line D-D'.

Figure 6:
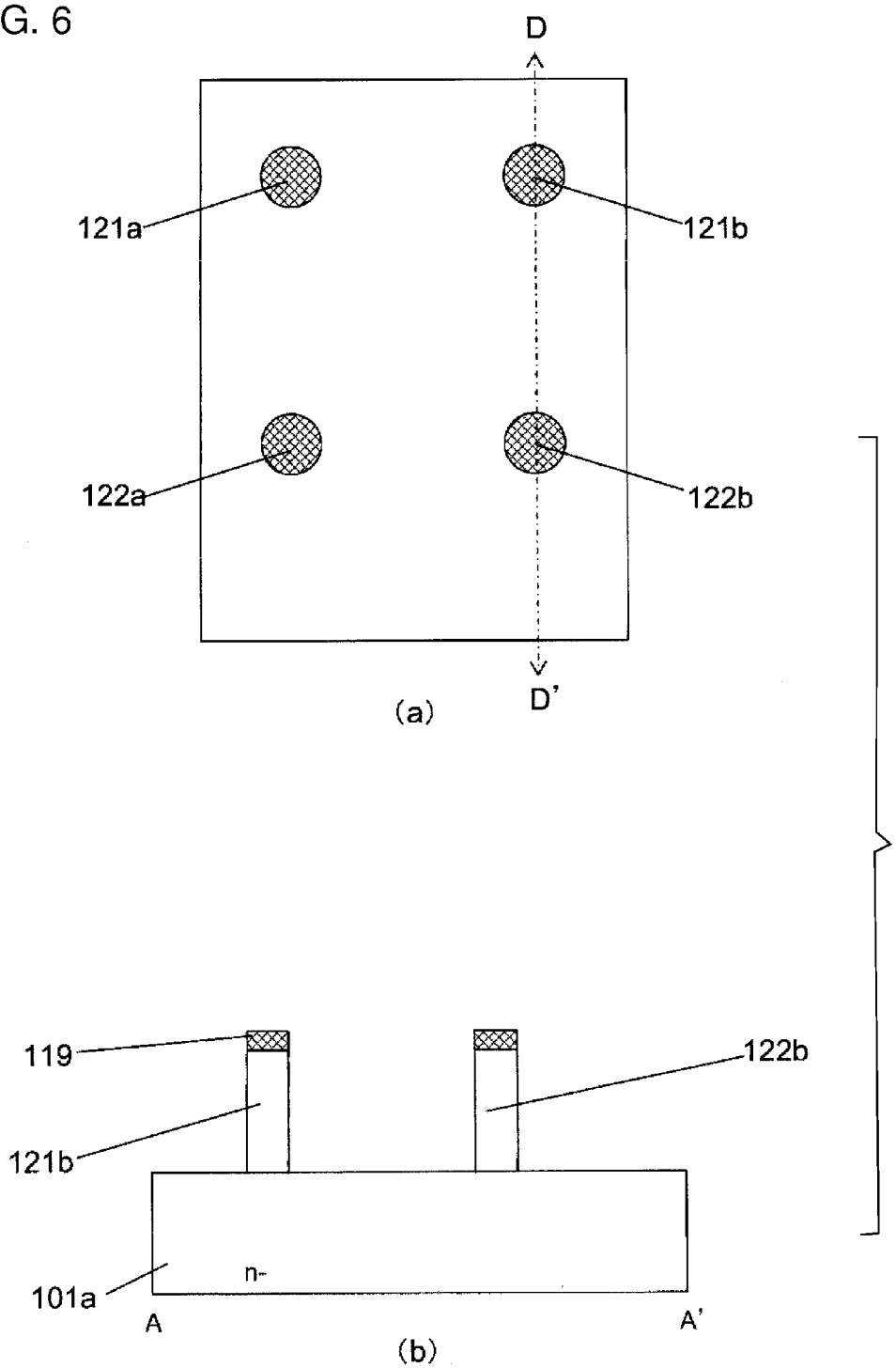
FIG. 6 includes process charts illustrating a fabrication method of the first embodiment of the present invention in the order of processes.

As illustrated in FIG. 6, a silicon nitride film or the like is formed on a substrate. A pattern including pillar-shaped silicon layers (121a, 122a, 121b, and 122b) is formed by lithography and is etched, thereby forming a silicon nitride film mask 119 and pillar-shaped silicon layers (121a, 122a, 121b, and 122b). Next, an n-well, which is a first well 101a, is formed in an SRAM cell array by implanting an impurity or the like.

Figure 7:
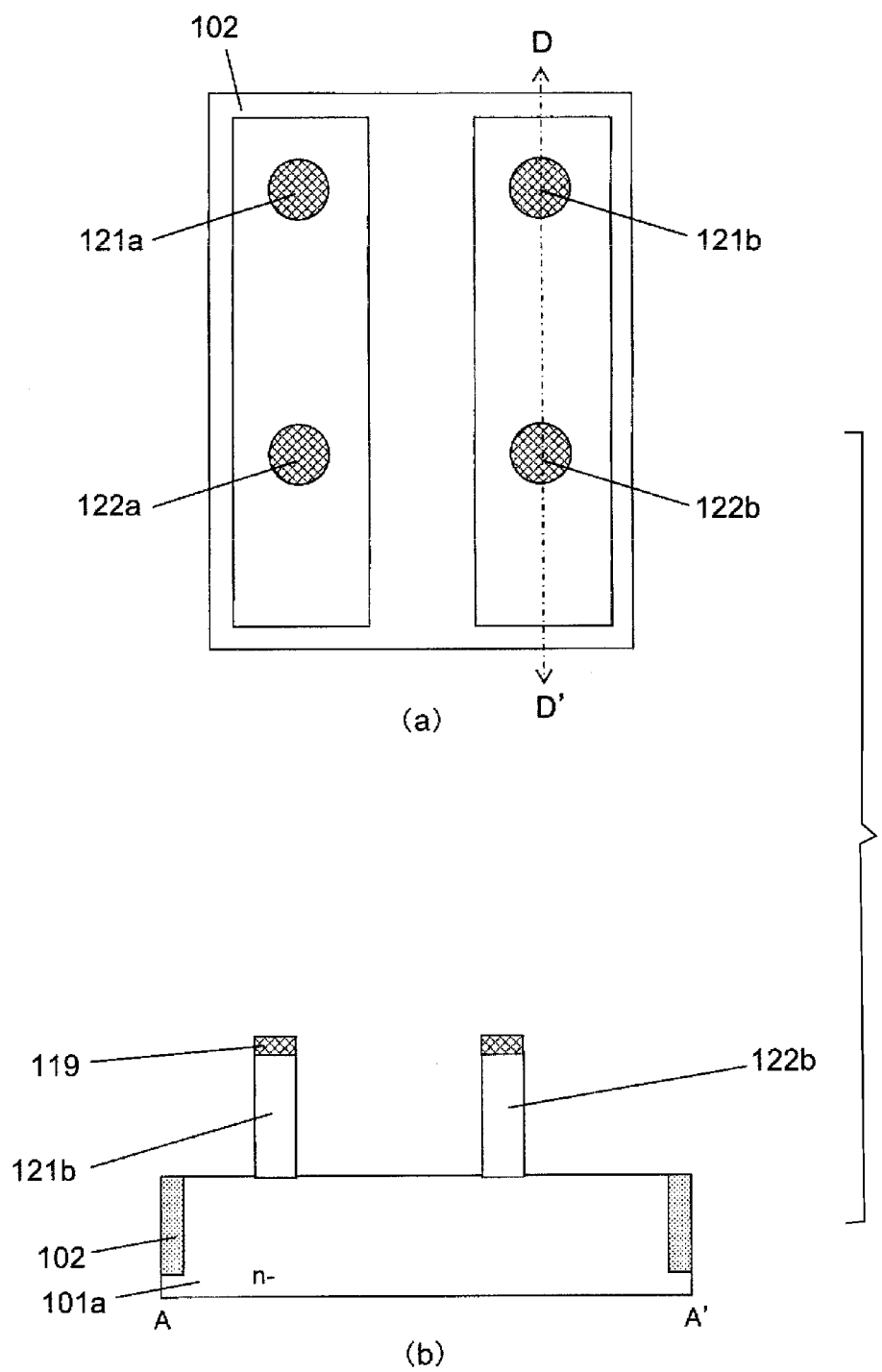
FIG. 7 includes process charts illustrating the fabrication method of the first embodiment of the present invention in the order of processes.

As illustrated in FIG. 7, an element separation layer 102 is formed. The element separation layer 102 is formed by etching a groove pattern, embedding an insulating film such as an oxide film into the groove pattern by chemical vapor deposition (CVD) or the like, and removing an unnecessary oxide film on the substrate by performing dry etching, wet etching, or the like. Accordingly, a diffusion layer pattern becoming a first storage node Qa1 and a second storage node Qb1 is formed on the substrate.

Figure 8:
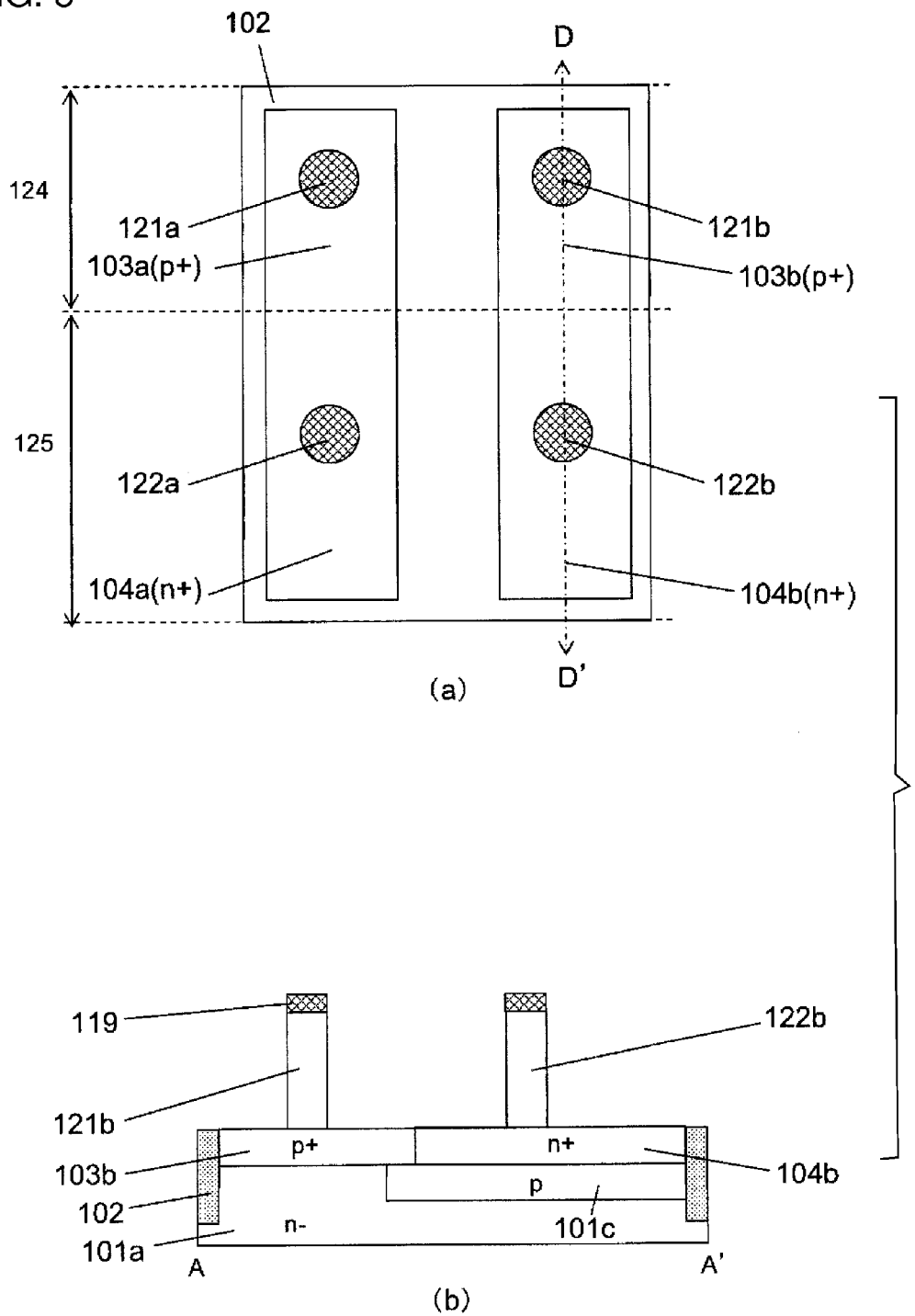
FIG. 8 includes process charts illustrating the fabrication method of the first embodiment of the present invention in the order of processes.

As illustrated in FIG. 8, an impurity is introduced into a p+ implanting area 124 and an n+ implanting area 125 by performing ion implantation or the like, and drain diffusion layers (103a, 103b, 104a, and 104b) are formed at the bottom of the pillar-shaped silicon layers on the substrate. To suppress leak to the substrate from the n+ diffusion layer 104b, which has the same conductivity type as the n-well, which is the first well 101a, a second leak preventing diffusion layer 101c is formed. The second leak preventing diffusion layer 101c can be formed by implanting an impurity or the like using a mask of the n+ implanting area 125.

Figure 9:
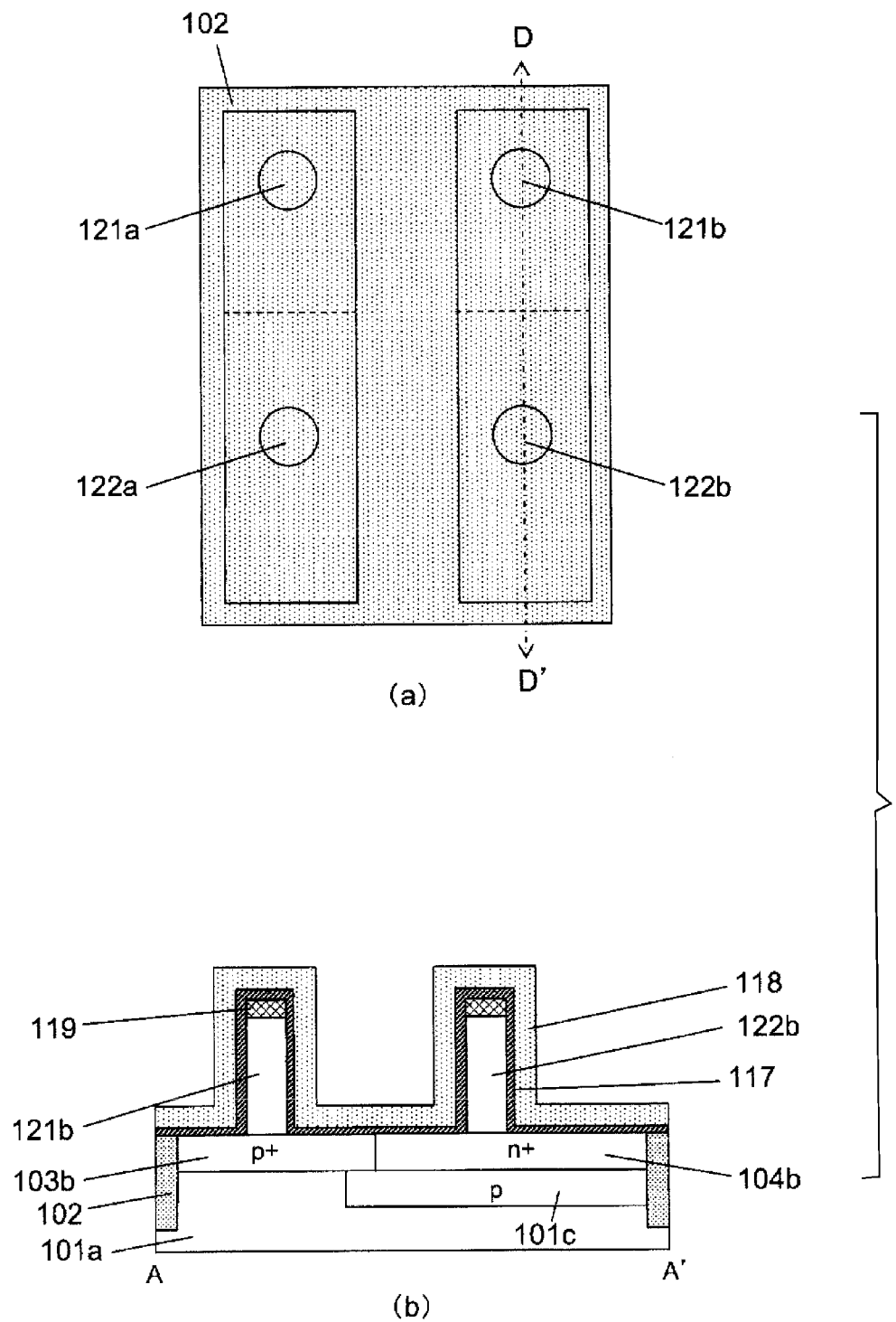
FIG. 9 includes process charts illustrating the fabrication method of the first embodiment of the present invention in the order of processes.

As illustrated in FIG. 9, a gate insulating film 117 and a gate conducting film 118 are formed. The gate insulating film 117 is formed of an oxide film or a high-k film. Also, the gate conducting film 118 is formed of polysilicon, a metal film, or a multilayer structure including polysilicon and a metal film.

Figure 10:
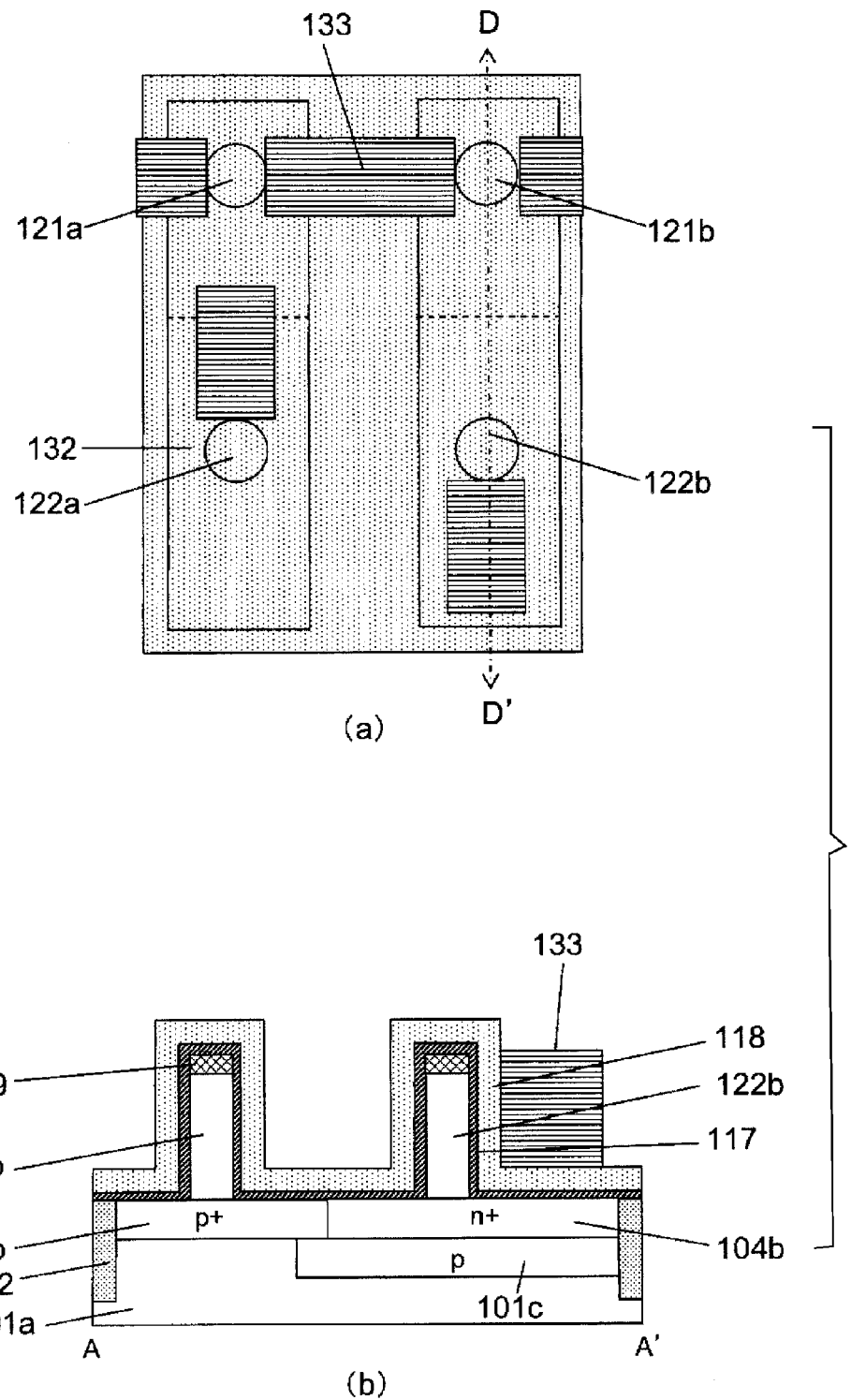
FIG. 10 includes process charts illustrating the fabrication method of the first embodiment of the present invention in the order of processes.

As illustrated in FIG. 10, a gate wiring pattern is formed by lithography using a resist 133 or the like.

Figure 11:
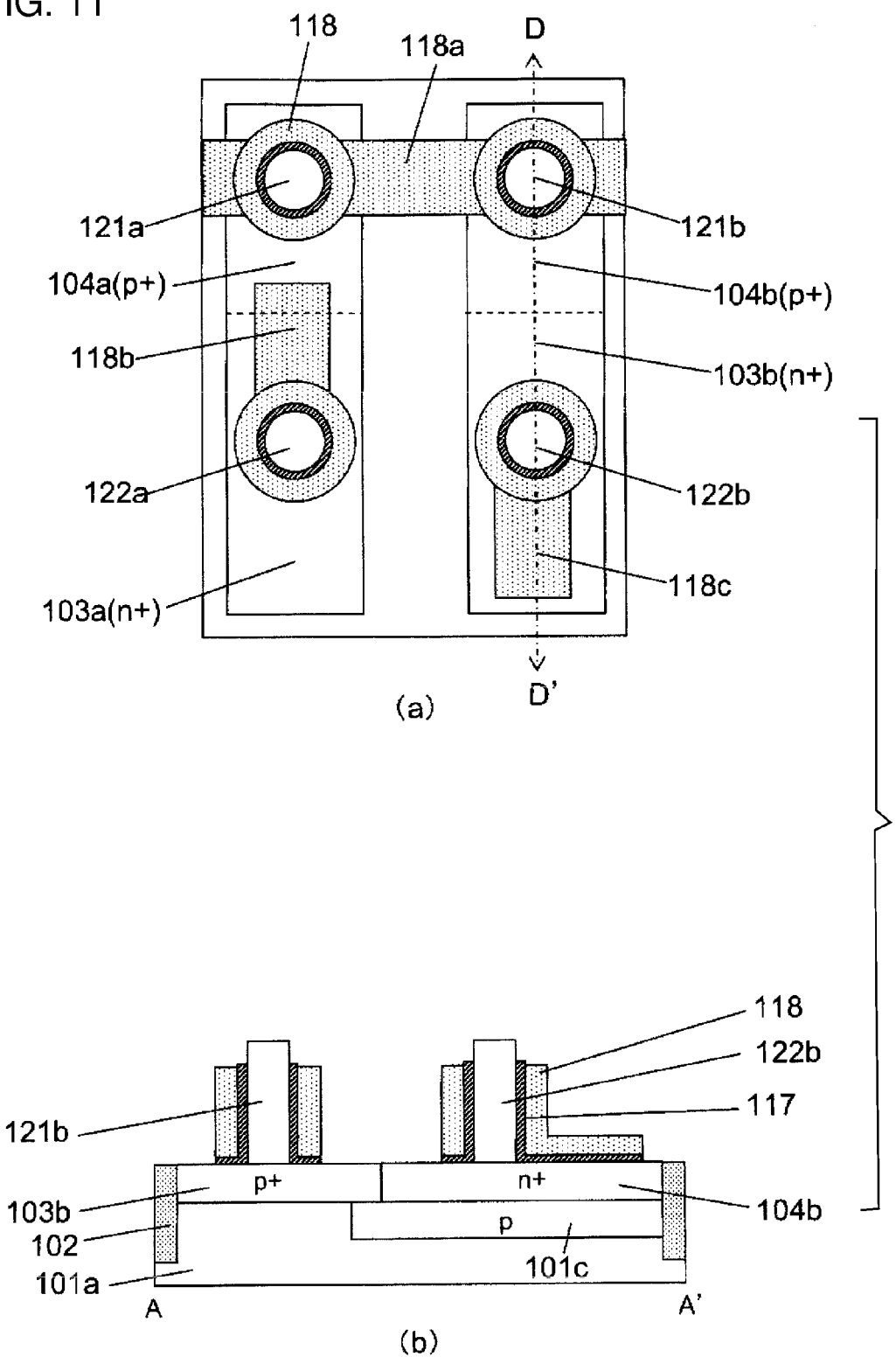
FIG. 11 includes process charts illustrating the fabrication method of the first embodiment of the present invention in the order of processes.

As illustrated in FIG. 11, the gate conducting film 118 and the gate insulating film 117 are etched and removed by using the resist 133 as a mask. Accordingly, gate lines (118a to 118c) are formed. Thereafter, the mask 119 on the pillars is removed.

Figure 12:
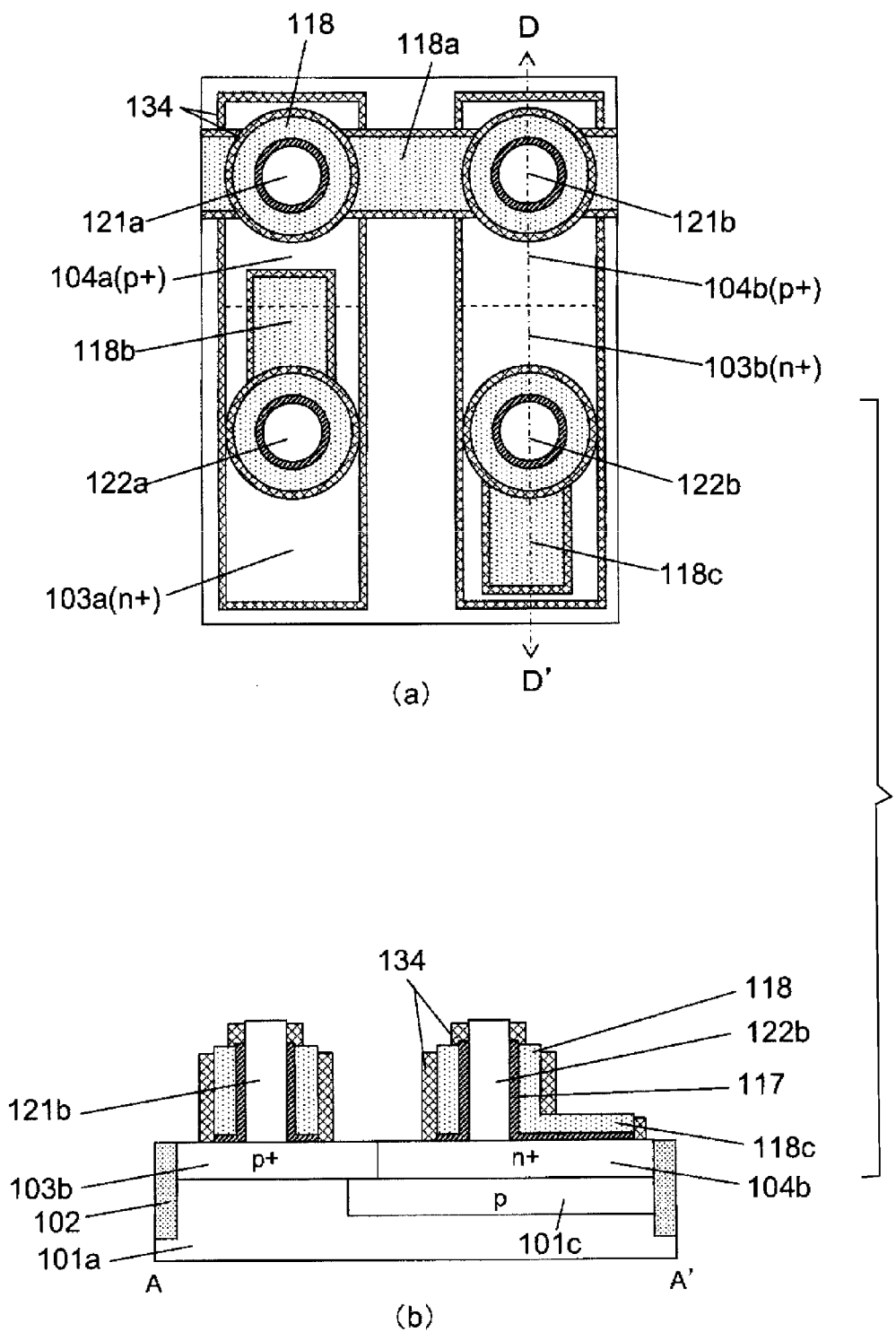
FIG. 12 includes process charts illustrating the fabrication method of the first embodiment of the present invention in the order of processes.

As illustrated in FIG. 12, after an insulating film such as a silicon nitride film is formed, etch back is performed to obtain a structure in which an insulating film 134 such as a silicon nitride film covers the sidewalls of the pillar-shaped silicon layers and the sidewall of a gate electrode.

Figure 13:
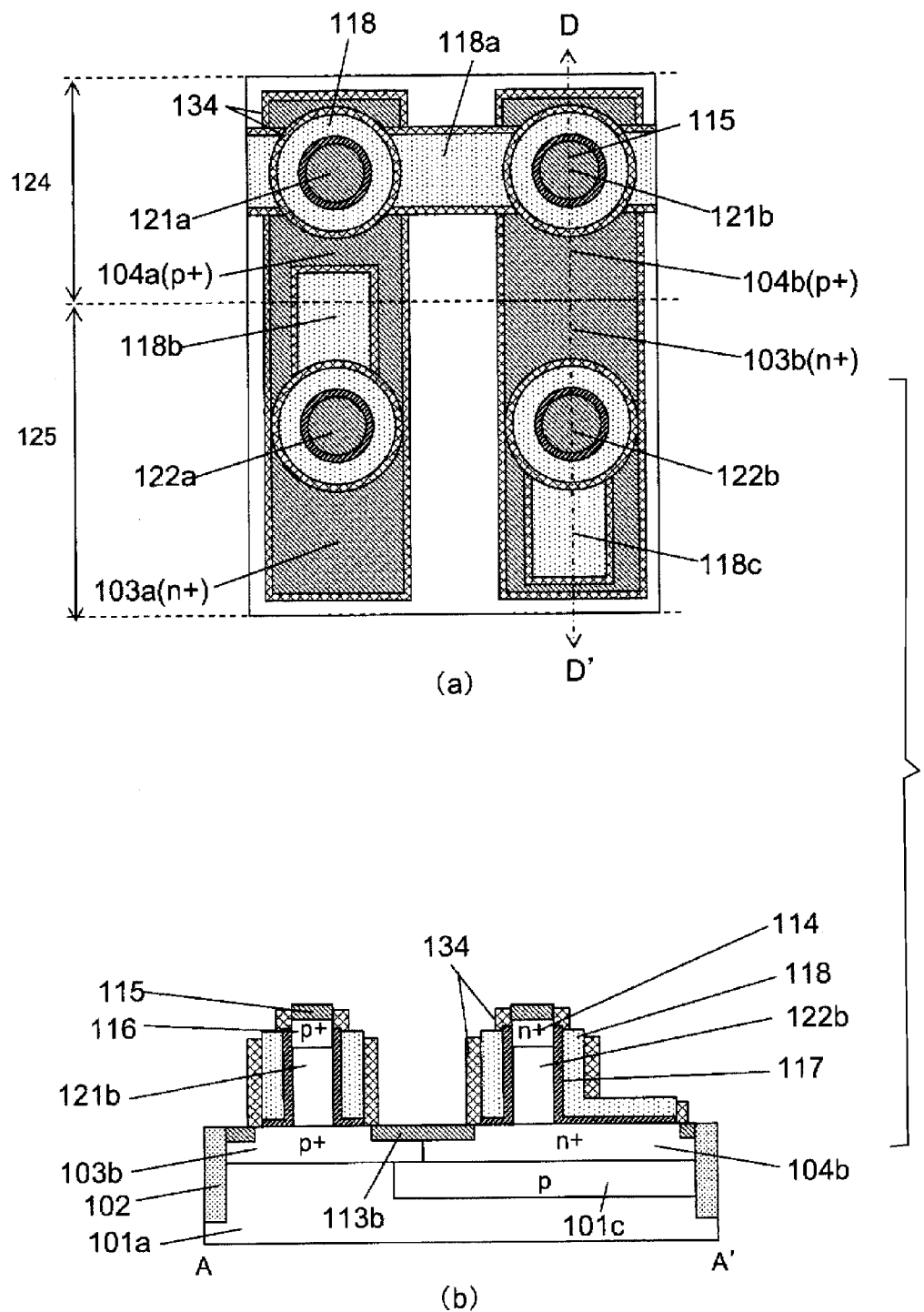
FIG. 13 includes process charts illustrating the fabrication method of the first embodiment of the present invention in the order of processes.

As illustrated in FIG. 13, source diffusion layers (114 and 116) on the top of the pillar-shaped silicon layers are formed by introducing an impurity into the p+ implanting area 124 and the n+ implanting area 125 by performing ion implantation or the like. Next, metal such as Ni is sputtered and subjected to heat treatment, thereby forming silicide layers (113a and 113b) on the drain diffusion layers and a silicide layer 115 on the source diffusion layers on the top of the pillar-shaped silicon layers.

Here, short circuit between the drain and the gate and between the source and the gate, resulting from the silicide layers, can be suppressed by the insulating film 134 such as a silicon nitride film covering the sidewalls of the pillar-shaped silicon layers and of the gate electrode.

Figure 14:
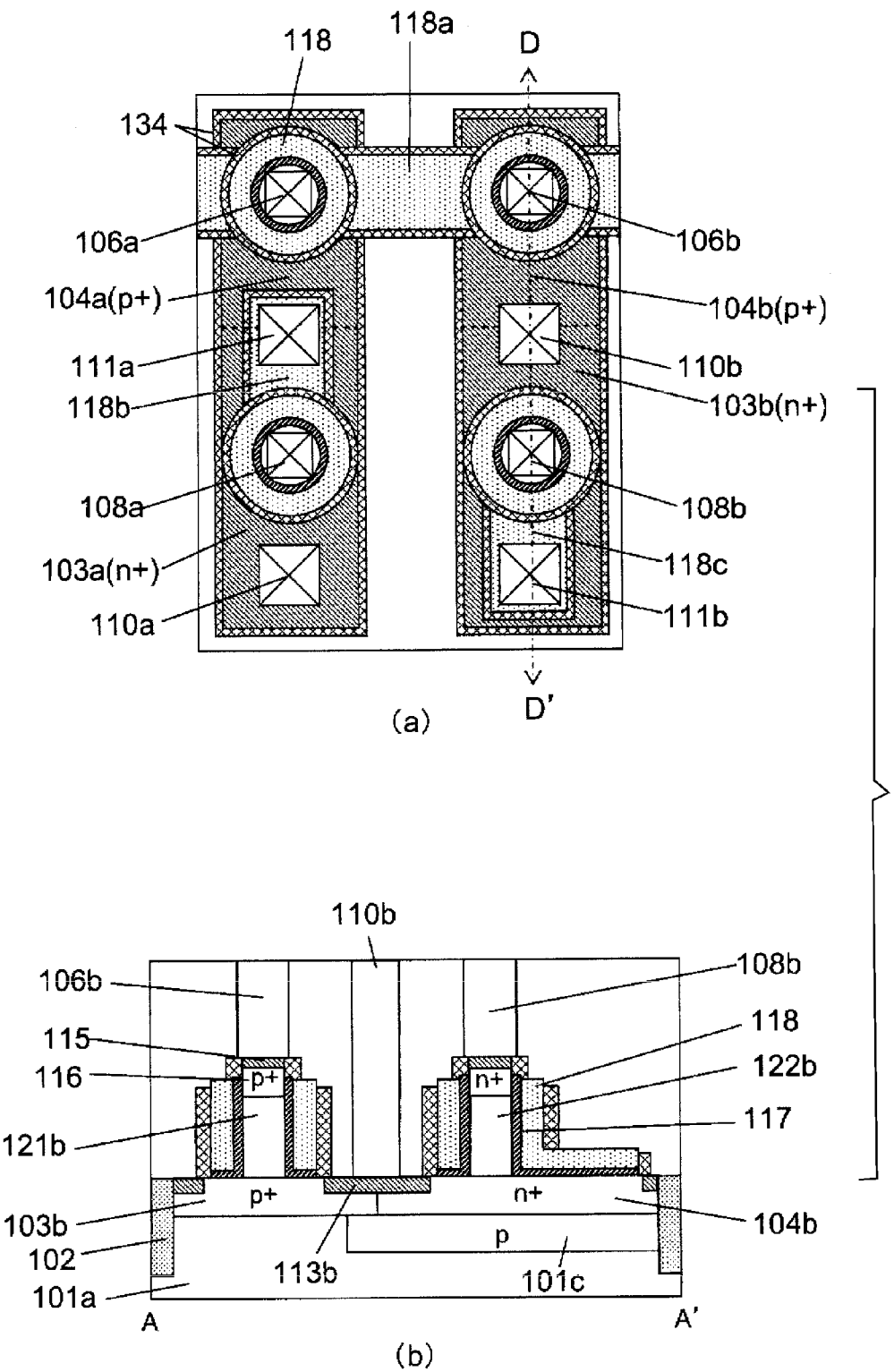
FIG. 14 includes process charts illustrating the fabrication method of the first embodiment of the present invention in the order of processes.

As illustrated in FIG. 14, after a silicon oxide film which is an interlayer film is formed, contacts (106a, 106b, 108a, 108b, 110a, 110b, 111a, and 111b) are formed.

Second Embodiment

Figure 15:
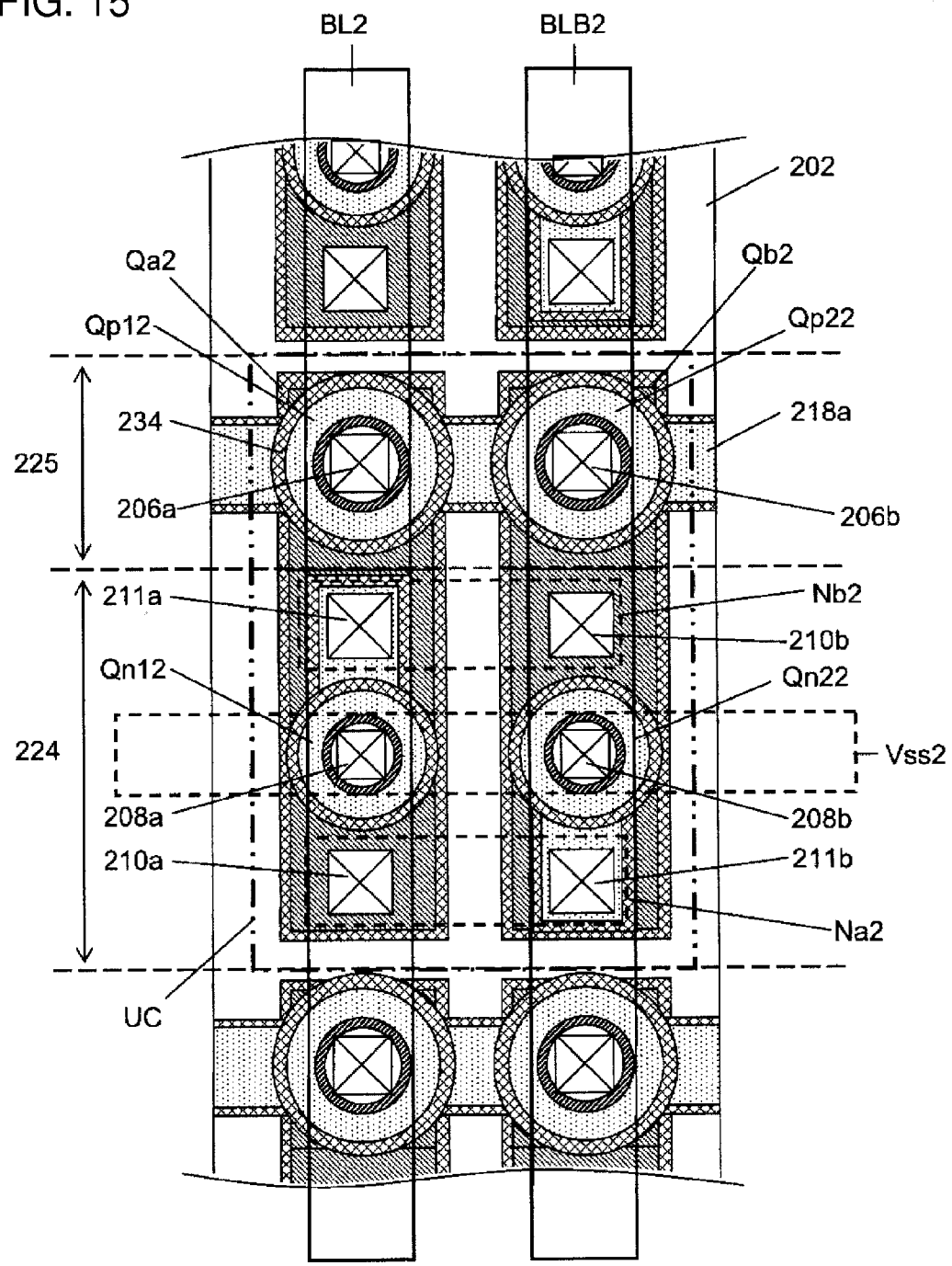
FIG. 15 is a plan view of an SRAM indicating a second embodiment of the present invention.

FIG. 15 illustrates an SRAM layout of a second embodiment. In this embodiment, a point different from the first embodiment is the point that the shape of pillar-shaped silicon layers forming access transistors and the size of pillar-shaped silicon layers forming driver transistors are different. In the loadless 4T-SRAM of the embodiment of the present invention, it is necessary to set the leak current of the access transistors to be higher than the leak current of the driver transistors. As means for increasing the leak current of the access transistors, as illustrated in FIG. 15, pillar-shaped silicon layers forming the access transistors may be set to be large, thereby increasing the leak current. The shape of the pillar-shaped silicon layers need not be circular and may be elliptical or the like.

In contrast, to improve the read out margin, the pillar-shaped silicon layers of the driver transistors may be formed to be large, thereby increasing the current of the driver transistors. Accordingly, the read out margin can be improved.

In this embodiment, the same pillar layout as that in the first embodiment is used by way of example. Actually, however, the layout is not limited to that of the first embodiment, and this embodiment is similarly applicable to layouts of other embodiments.

The other points are the same as those in the configuration discussed in the first embodiment, and hence, description thereof is omitted.

Third Embodiment

Figure 16:
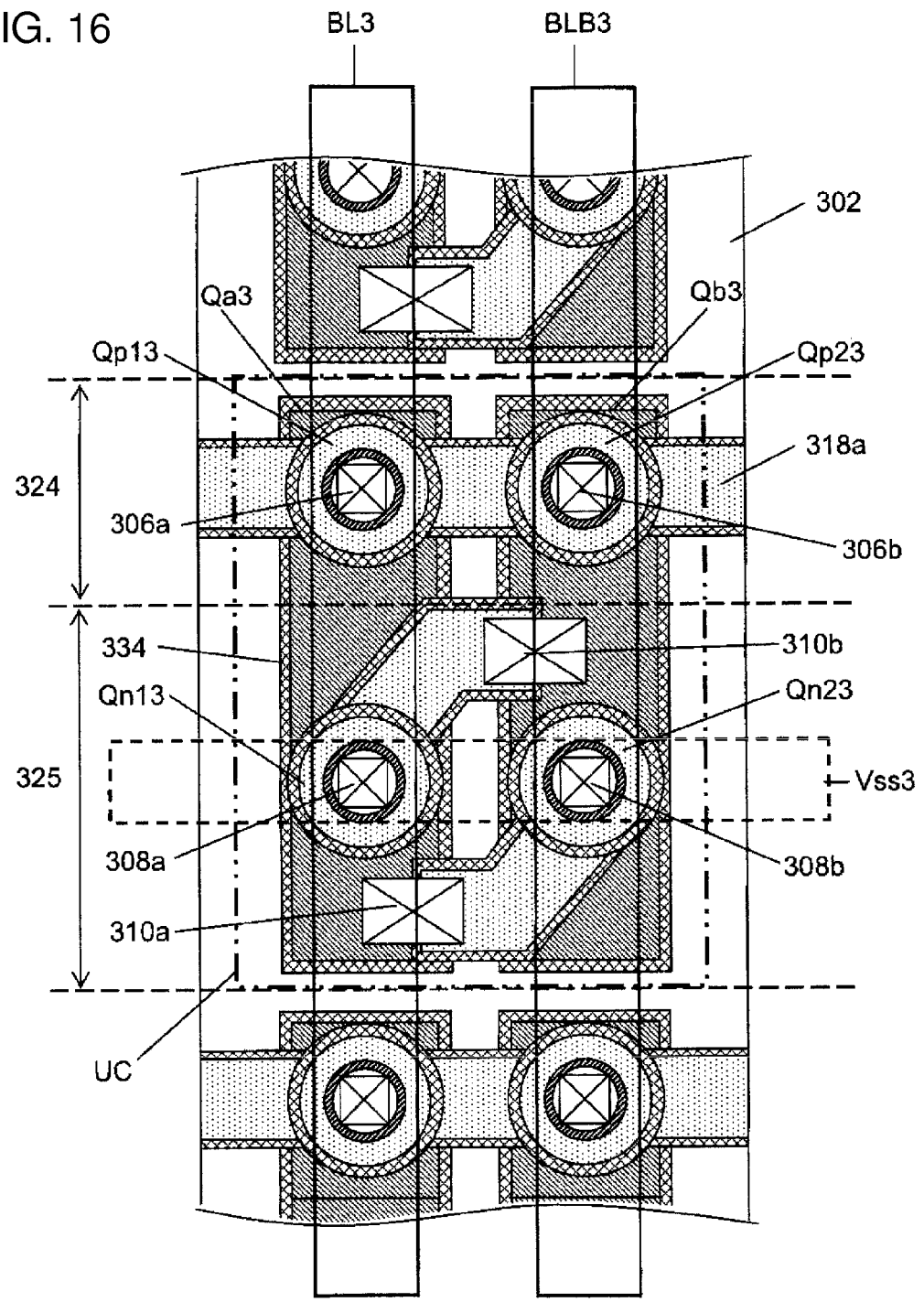
FIG. 16 is a plan view of an SRAM indicating a third embodiment of the present invention.

FIG. 16 illustrates an SRAM cell layout of a third embodiment. This embodiment is different from the first embodiment in the following points. Qa3, which is a storage node formed of the first diffusion layers on the substrate, and a gate line extending from a gate electrode of a driver transistor Qn23 are connected by a common contact 310a formed over the storage node Qa3 and the gate line. Qb3, which is a storage node formed of the second diffusion layers on the substrate, and a gate line extending from a gate electrode of a driver transistor Qn13 are connected by a common contact 310b formed over the storage node Qb3 and the gate line. The number of contacts in the SRAM cell can be reduced by directly connecting a gate and a storage node by a contact, instead of a wiring layer, as described above. The cell area can be reduced by adjusting the arrangement of the pillar-shaped silicon layers and the contacts.

As an example of the hierarchical wiring configuration, it is possible to realize a configuration in which Vss3 is formed of a lower layer line and bit lines (BL3 and BLB3) are formed of upper layer lines. Note that, in this embodiment, a node connection line and a node connection line are formed of contacts.

In this embodiment, the same pillar layout as that in the first embodiment is used by way of example. Actually, however, the layout is not limited to that of the first embodiment, and this embodiment is similarly applicable to other layouts.

The other points are the same as those in the configuration discussed in the first embodiment, and hence, description thereof is omitted.

Fourth Embodiment

Figure 17:
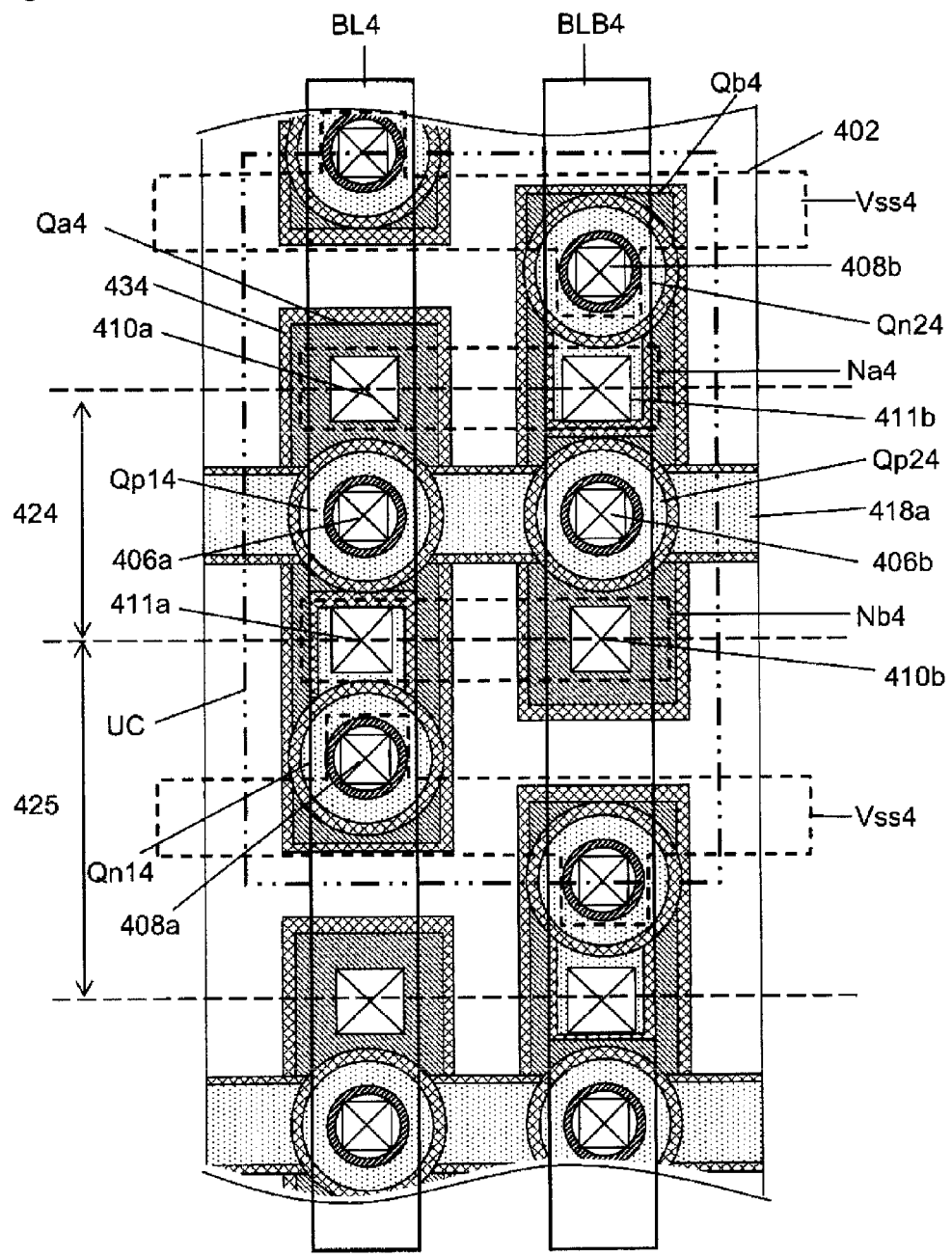
FIG. 17 is a plan view of an SRAM indicating a fourth embodiment of the present invention.

FIG. 17 illustrates an SRAM cell layout of a fourth embodiment. This embodiment is different from the first embodiment in the following points. In the first embodiment, on the storage node Qa1, the contact 110a is arranged adjacent only to the driver transistor Qn11. However, on the storage node Qb1, the contact 110b is arranged on a diffusion layer between the driver transistor Qn21 and the access transistor Qp21. This layout asymmetry may generate asymmetry in characteristics of the SRAM cells, and the operation margin may become narrower. In this embodiment, the layout of an access transistor Qp14, contacts (410a and 411a), and a driver transistor Qn14 on a first storage node Qa4 is symmetrical to the layout of an access transistor Qp24, contacts (410b and 411b), and a driver transistor Qn24 on a second storage node Qb4. Therefore, there is no deterioration of the operation margin caused by the above-described asymmetry, and SRAM cells with a wide operation margin can be configured.

Note that, to share the wiring with other memory cells, the wiring of bit lines and the wiring of the ground potential are preferably arranged at a layer higher than the node connection lines, which are the wiring in each memory cell. In this embodiment, the node connection lines are formed of contacts.

As an example of the hierarchical wiring configuration, it is possible to realize a configuration in which Vss4 is formed of a lower layer line and bit lines (BL4 and BLB4) are formed of upper layer lines.

Fifth Embodiment

Figure 18:
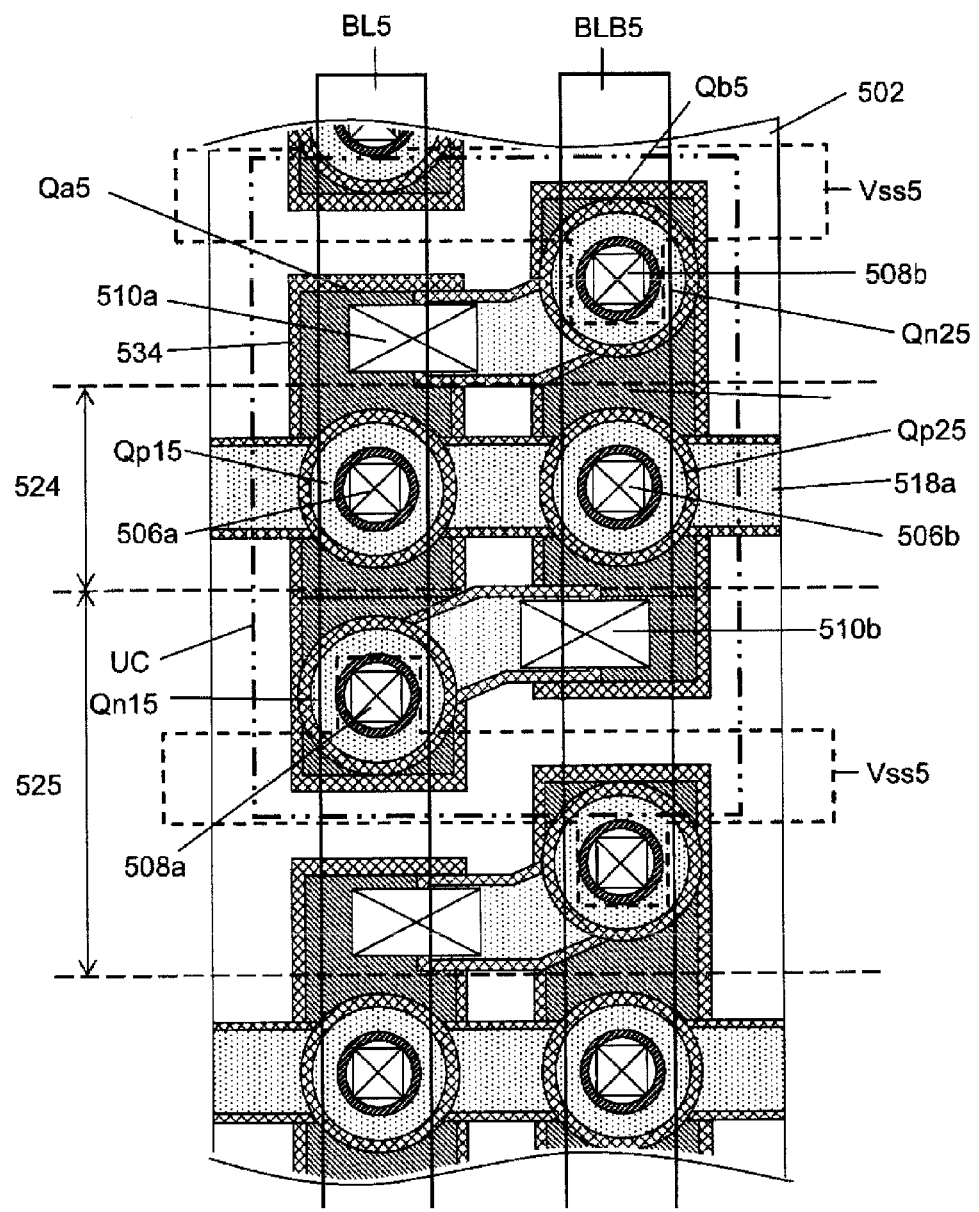
FIG. 18 is a plan view of an SRAM indicating a fifth embodiment of the present invention.

FIG. 18 illustrates an SRAM cell layout of a fifth embodiment. This embodiment has symmetrical layouts, like the fourth embodiment. Therefore, SRAM cells with a wide operation margin can be configured. Also, like the third embodiment, Qa5, which is a storage node formed of the first diffusion layers on the substrate, and a gate line extending from a gate electrode of a driver transistor Qn25 are connected by a common contact 510a formed over the storage node Qa5 and the gate line. Qb5, which is a storage node formed of the second diffusion layers on the substrate, and a gate line extending from a gate electrode of a driver transistor Qn15 are connected by a common contact 510b formed over the storage node Qb5 and the gate line.

Note that, to share the wiring with other memory cells, the wiring of bit lines and the wiring of the ground potential are preferably arranged at a layer higher than the node connection lines, which are the wiring in each memory cell. In this embodiment, the node connection lines are formed of contacts.

As an example of the hierarchical wiring configuration, it is possible to realize a configuration in which Vss5 is formed of a lower layer line and bit lines (BL5 and BLB5) are formed of upper layer lines. Note that, in this embodiment, a node connection line Na5 and a node connection line Nb5 are formed of contacts.

Figure 19:
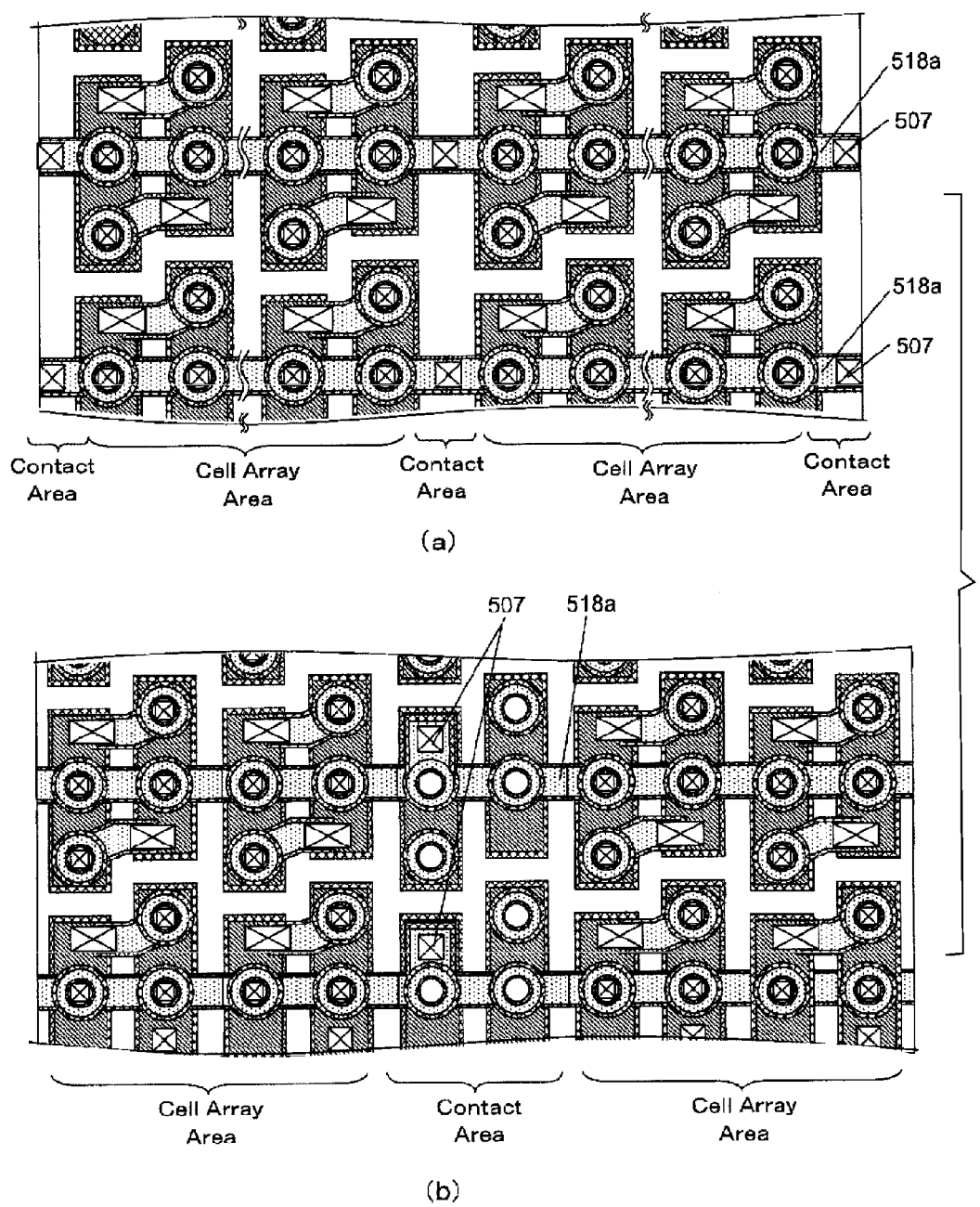
FIG. 19 includes plan views of the SRAM indicating the fifth embodiment of the present invention.
Figure 20:
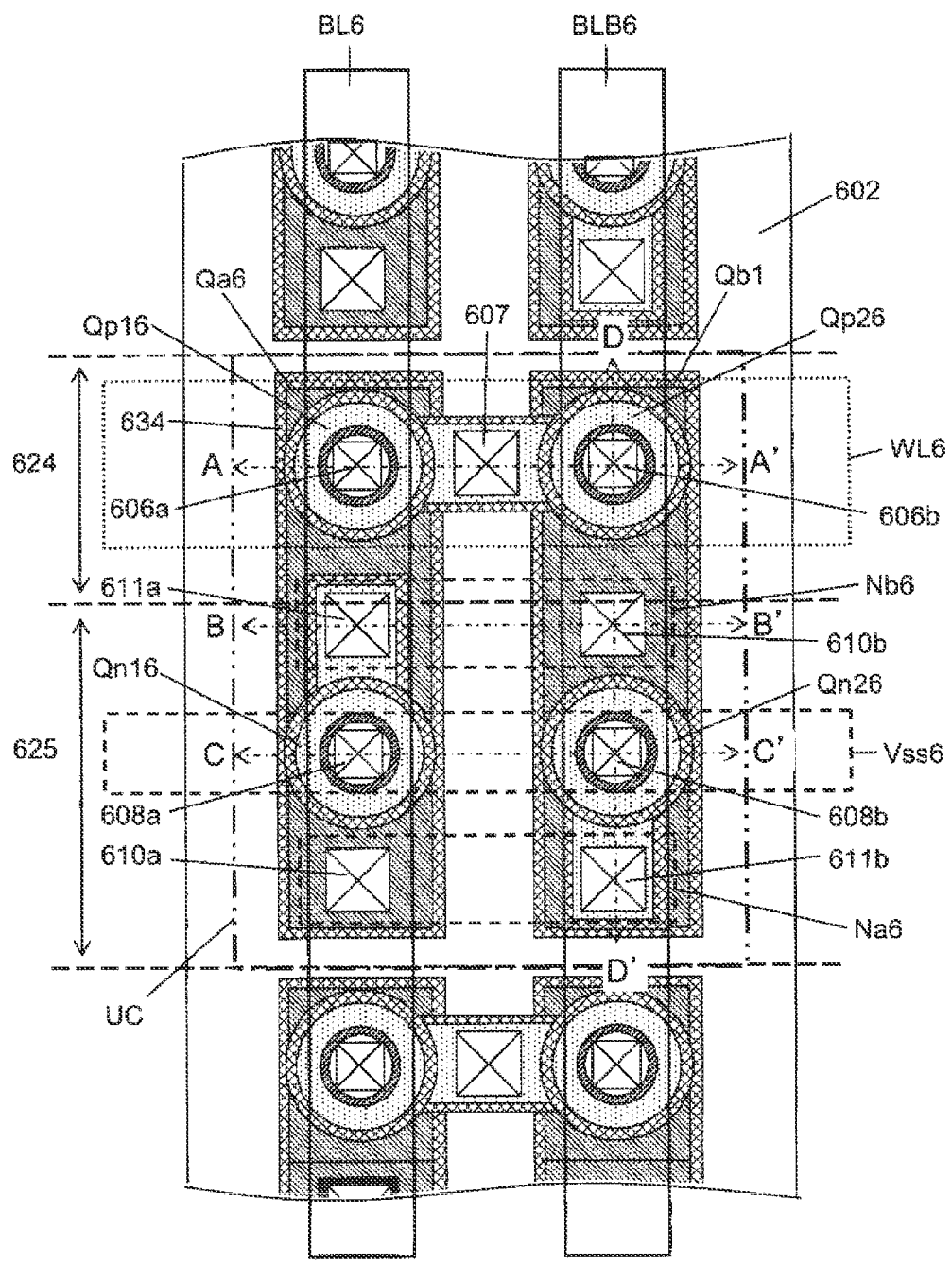
FIG. 20 is a plan view of an SRAM using SGTs of the related art.
Figure 21A:
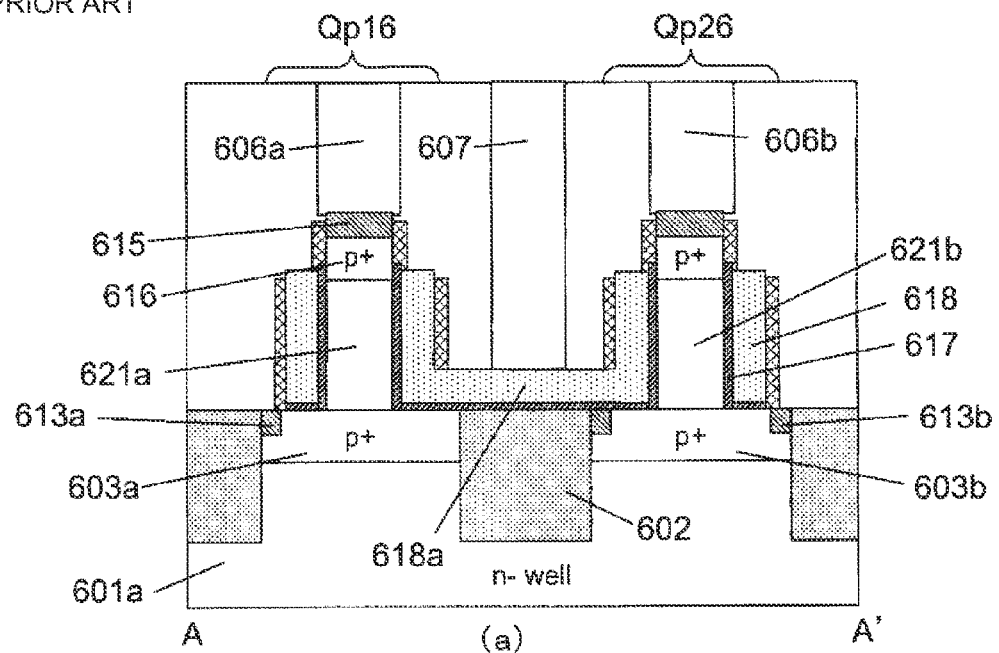
FIG. 21A is a cross-sectional view of the SRAM using the SGTs of the related art.
Figure 21B:
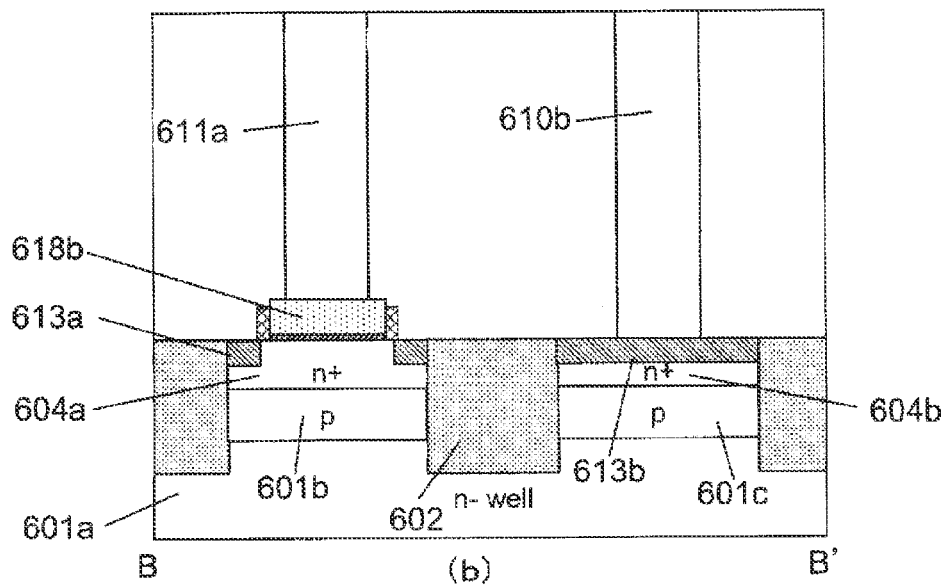
FIG. 21B is a cross-sectional view of the SRAM using the SGTs of the related art.
Figure 21C:
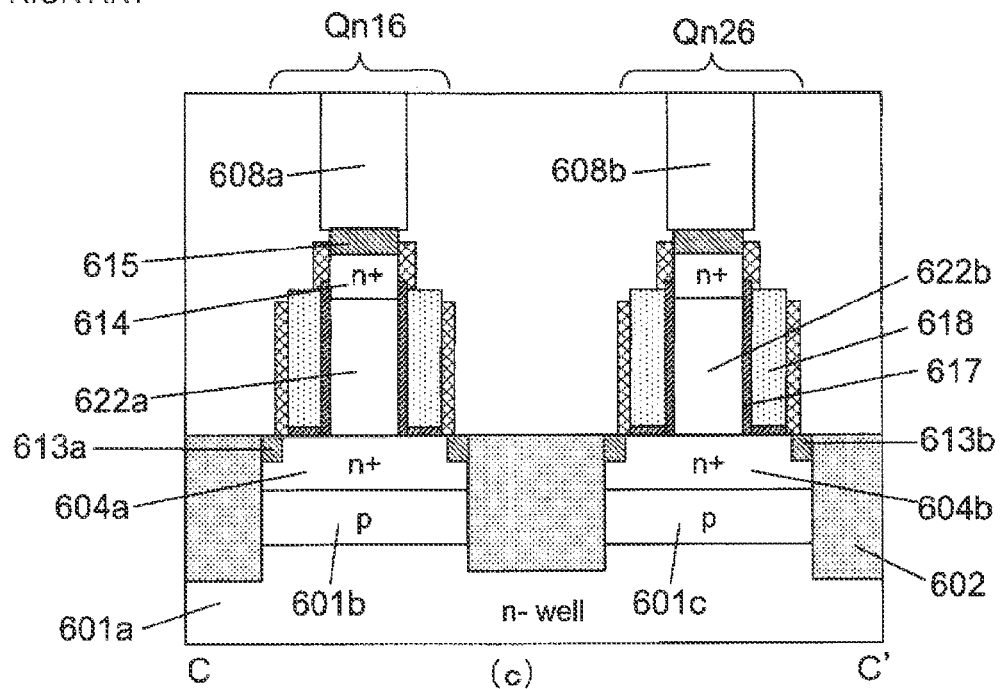
FIG. 21C is a cross-sectional view of the SRAM using the SGTs of the related art.
Figure 21D:
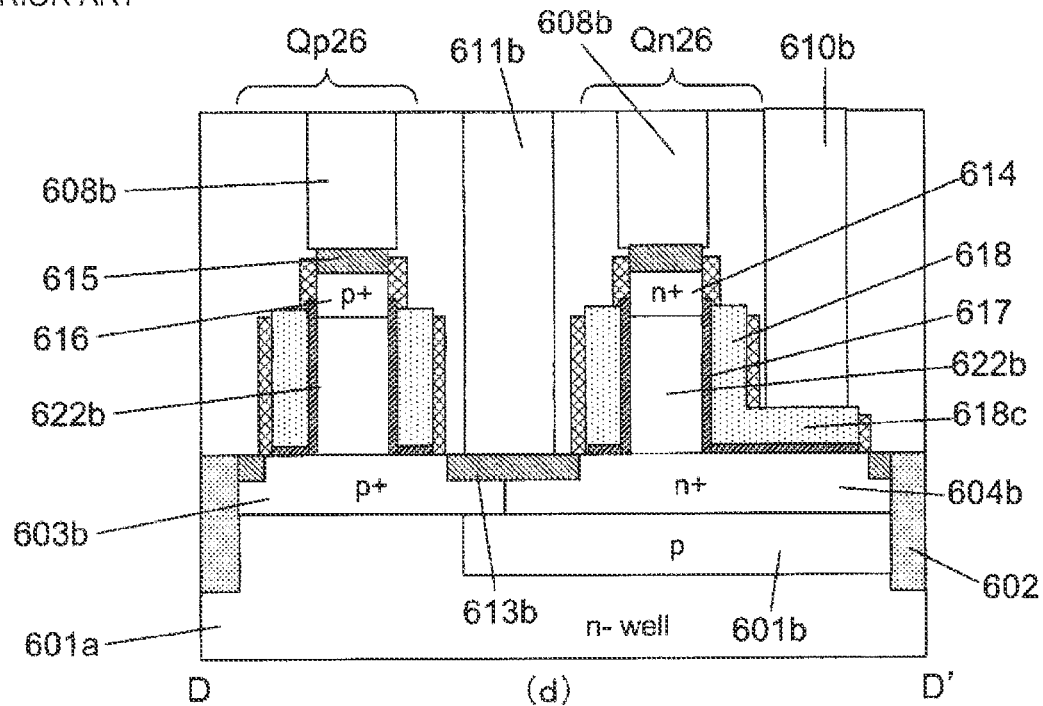
FIG. 21D is a cross-sectional view of the SRAM using the SGTs of the related art.

FIG. 19, part (a), is a plan view of a portion of an SRAM memory cell array including a plurality of SRAM memory cells. In a cell array area in the diagram, a plurality of memory cells is arranged in the horizontal direction, and a word line 518a is shared among the plurality of memory cells arranged in the horizontal direction. The word line is connected to wiring at an upper layer by a contact 507 formed in a contact area and, as necessary, backed by a wiring layer. Therefore, unlike the SRAM cells in Japanese Unexamined Patent Application Publication No. 2011-61110, it is unnecessary to form, in each cell, a contact for the word line. Thus, the SRAM cell area can be reduced.

By connecting a plurality of cells to the word line 518a, there may be a problem of reading or writing delay due to delay of a signal on the word line at a cell distant from the word line contact 507. Therefore, the number of cells connected to the word line may be determined within the range where there is no problem of reading or writing delay.

FIG. 19, part (b), is a plan view of a portion of the SRAM cell array including a plurality of SRAM cells in another case. Similarly, in a cell array area in the diagram, a plurality of memory cells is arranged in the horizontal direction, and the word line 518a is shared among the plurality of memory cells arranged in the horizontal direction. However, in FIG. 19(b), as in the cell array area, pillars are arranged also in a contact area. By arranging pillars also in the contact area as above, errors between characteristics of SGTs adjacent to the contact area and characteristics of SGTs not adjacent to the contact area can be suppressed to the minimum.

The invention claimed is:
1. A semiconductor memory device, comprising:
a plurality of static memory cells, each including four MOS transistors arranged on a substrate;
said four MOS transistors respectively functioning as first and second PMOS access transistors and as first and second NMOS driver transistors, said first and second PMOS access transistors for supplying an electric charge in order to maintain data in a memory cell and accessing the memory cell, said first and second NMOS driver transistors for driving storage nodes in order to read data from the respective said memory cell;

wherein, in said first and second PMOS access transistors:

a P-type first diffusion layer, a first pillar-shaped semiconductor layer, and a P-type second diffusion layer are arranged in a hierarchical manner in a vertical direction on the substrate, the first pillar-shaped semiconductor layer is arranged between the first diffusion layer formed at the bottom of the first pillar-shaped semiconductor layer and the second diffusion layer formed on the top of the first pillar-shaped semiconductor layer, and a first gate is formed on a sidewall of the first pillar-shaped semiconductor layer;

wherein, in said first and second NMOS driver transistors:

an N-type third diffusion layer, a second pillar-shaped semiconductor layer, and an N-type fourth diffusion layer are arranged in a hierarchical manner in the vertical direction on the substrate, the second pillar-shaped semiconductor layer is arranged between the third diffusion layer formed at the bottom of the second pillar-shaped semiconductor layer and the fourth diffusion layer formed on the top of the second pillar-shaped semiconductor layer, and a second gate is formed on a sidewall of the second pillar-shaped semiconductor layer;

wherein said first PMOS access transistor and said first NMOS driver transistor are arranged adjacent to each other, wherein said second PMOS access transistor and said second NMOS driver transistor are arranged adjacent to each other, wherein a first well common to a plurality of memory cells for supplying potential to the substrate is formed on the substrate, wherein the P-type first diffusion layer formed at the bottom of said first PMOS access transistor and the N-type third diffusion layer formed at the bottom of said first NMOS driver transistor are connected to each other, wherein the P-type first diffusion layer and the N-type third diffusion layer connected to each other function as a first storage node for maintaining data stored in the memory cell, wherein, to prevent leakage between the N-type third diffusion layer or the P-type first diffusion layer and the first well, a first leak preventing diffusion layer having a conductivity type opposite to the first well is formed between the N-type third diffusion layer or the P-type first diffusion layer and the first well, so that the bottom of the first leak preventing diffusion layer becomes shallower than an element separation layer, wherein the first leak preventing diffusion layer is directly connected to the P-type first diffusion layer or the N-type third diffusion layer, wherein the P-type first diffusion layer formed at the bottom of said second PMOS access transistor, and the N-type third diffusion layer formed at the bottom of said second NMOS driver transistor are connected to each other, wherein the P-type first diffusion layer and the N-type third diffusion layer connected to each other function as a second storage node for maintaining data stored in the memory cell, wherein, to prevent leakage between the N-type third diffusion layer or the P-type first diffusion layer and the first well, a second leak preventing diffusion layer having a conductivity type opposite to the first well is formed between the N-type third diffusion layer or the P-type first diffusion layer and the first well, so that the bottom of the second leak preventing diffusion layer becomes shallower than the element separation layer, wherein the second leak preventing diffusion layer is directly connected to the P-type first diffusion layer or the N-type third diffusion layer, wherein gates of said first and second PMOS access transistors are connected to each other by a first gate line, and the first gate line forms a word line by connecting to gates of said first and second PMOS access transistors in two or more memory cells adjacent to one another, and wherein, for each group of memory cells adjacent to one another, a first contact is formed on the first gate line serving as the word line.

2. The semiconductor memory device according to claim 1, wherein, as in a memory cell area, pillars are arranged in an area in which the first contact is formed on the first gate line serving as the word line.

3. The semiconductor memory device according to claim 1, wherein:

a second gate line extending from the gate of said first NMOS driver transistor is connected to the diffusion layers functioning as the second storage node by a second contact; and a third gate line extending from the gate of said second NMOS driver transistor is connected to the diffusion layers functioning as the first storage node by a third contact.

4. The semiconductor memory device according to claim 1, wherein:

a peripheral length of sidewalls of the pillar-shaped semiconductor layers forming said first and second NMOS driver transistors is longer than or equal to a peripheral length of sidewalls of the pillar-shaped semiconductor layers forming said first and second PMOS access transistors; or the peripheral length of the sidewalls of the pillar-shaped semiconductor layers forming said first and second NMOS driver transistors is shorter than or equal to the peripheral length of the sidewalls of the pillar-shaped semiconductor layers forming said first and second PMOS access transistors.

5. The semiconductor memory device according to claim 1, wherein:

said four MOS transistors are arranged in two rows and two columns;

said first PMOS access transistor is arranged at a first column of a first row;

said first NMOS driver transistor is arranged at a first column of a second row;

said second PMOS access transistor is arranged at a second column of the first row; and said second NMOS driver transistor is arranged at a second column of the second row.

6. The semiconductor memory device according to claim 1, wherein said four MOS transistors are arranged as follows:

said first PMOS access transistor and said second PMOS access transistor are arranged adjacent one another;

in one direction orthogonal to a direction in which said first PMOS access transistor and said second PMOS access transistor are arranged adjacent one another, said first NMOS driver transistor is arranged adjacent said first PMOS access transistor; and in the other direction orthogonal to the direction in which said first PMOS access transistor and said second PMOS access transistor are arranged adjacent one another, said second NMOS driver transistor is arranged adjacent said second PMOS access transistor.

* * * * *